US009722558B2

(12) United States Patent
Kanehara et al.

(10) Patent No.: US 9,722,558 B2
(45) Date of Patent: Aug. 1, 2017

(54) ACCELERATION INFORMATION TRANSMISSION DEVICE

(75) Inventors: Shunichi Kanehara, Yamato (JP); Koji Shionome, Yamato (JP)

(73) Assignee: NISSAN MOTOR CO., LTD., Yokohama-shi (JP)

( * ) Notice: Subject to any disclaimer, the term of this patent is extended or adjusted under 35 U.S.C. 154(b) by 528 days.

(21) Appl. No.: 13/978,991

(22) PCT Filed: Jan. 25, 2012

(86) PCT No.: PCT/JP2012/051536
§ 371 (c)(1),
(2), (4) Date: Jul. 10, 2013

(87) PCT Pub. No.: WO2012/105384
PCT Pub. Date: Aug. 9, 2012

(65) Prior Publication Data
US 2013/0294620 A1 Nov. 7, 2013

(30) Foreign Application Priority Data
Feb. 4, 2011 (JP) ................. 2011-023057

(51) Int. Cl.
*H03G 3/00* (2006.01)
*H03G 3/20* (2006.01)
*G01P 1/08* (2006.01)
*H04R 5/02* (2006.01)
*B60Q 9/00* (2006.01)

(52) U.S. Cl.
CPC ............... *H03G 3/20* (2013.01); *G01P 1/08* (2013.01); *B60Q 9/00* (2013.01)

(58) Field of Classification Search
CPC .... H03G 3/20; B60Q 9/00; G01P 1/08; H04R 2499/13
USPC .................................................... 381/302, 86
See application file for complete search history.

(56) References Cited

U.S. PATENT DOCUMENTS 5,635,903 A * 6/1997 Koike ................... A63H 17/34
340/384.1
7,876,913 B2 1/2011 Kobayashi et al.
(Continued)

FOREIGN PATENT DOCUMENTS

JP 4173891 B2 8/2008
JP 2008-213726 A 9/2008
(Continued)

*Primary Examiner* — Vivian Chin
*Assistant Examiner* — Ammar Hamid
(74) *Attorney, Agent, or Firm* — Foley & Lardner LLP

(57) ABSTRACT

A sound volume is adjusted in accordance with a volume adjustment coefficient ka calculated in accordance with a coefficient map with respect to an accelerator opening angle APO and another volume adjustment coefficient kv calculated in accordance with the coefficient map with respect to a vehicle speed V. The coefficient map with respect to vehicle speed V is set such that, as accelerator opening angle APO becomes higher, volume adjustment coefficient ka becomes larger in a sigmoid configuration. In addition, the coefficient map with respect to accelerator opening angle APO is set such that, as vehicle speed V becomes higher, volume adjustment coefficient kv becomes smaller in the sigmoid configuration.

23 Claims, 22 Drawing Sheets

(56) References Cited

U.S. PATENT DOCUMENTS

| | | | |
|---|---|---|---|
| 8,045,723 B2 * | 10/2011 | Kobayashi | A63G 31/16 |
| | | | 381/61 |
| 2009/0052682 A1 | 2/2009 | Kuroiwa | |
| 2011/0085674 A1 * | 4/2011 | Fujikawa | G10K 15/02 |
| | | | 381/86 |

FOREIGN PATENT DOCUMENTS

| JP | 2009-046034 A | 3/2009 |
|---|---|---|
| JP | 2010-175854 A | 8/2010 |

* cited by examiner

EITHER ONE OF RIGHT OR LEFT SIDE DRAWING OF FIG. 18 ON VOLUME CONTROL MAP WITH RESPECT TO ACCELERATOR OPENING ANGLE

EITHER ONE OF RIGHT OR LEFT SIDE DRAWING OF FIG. 19 ON VOLUME CONTROL MAP WITH RESPECT TO VEHICLE SPEED

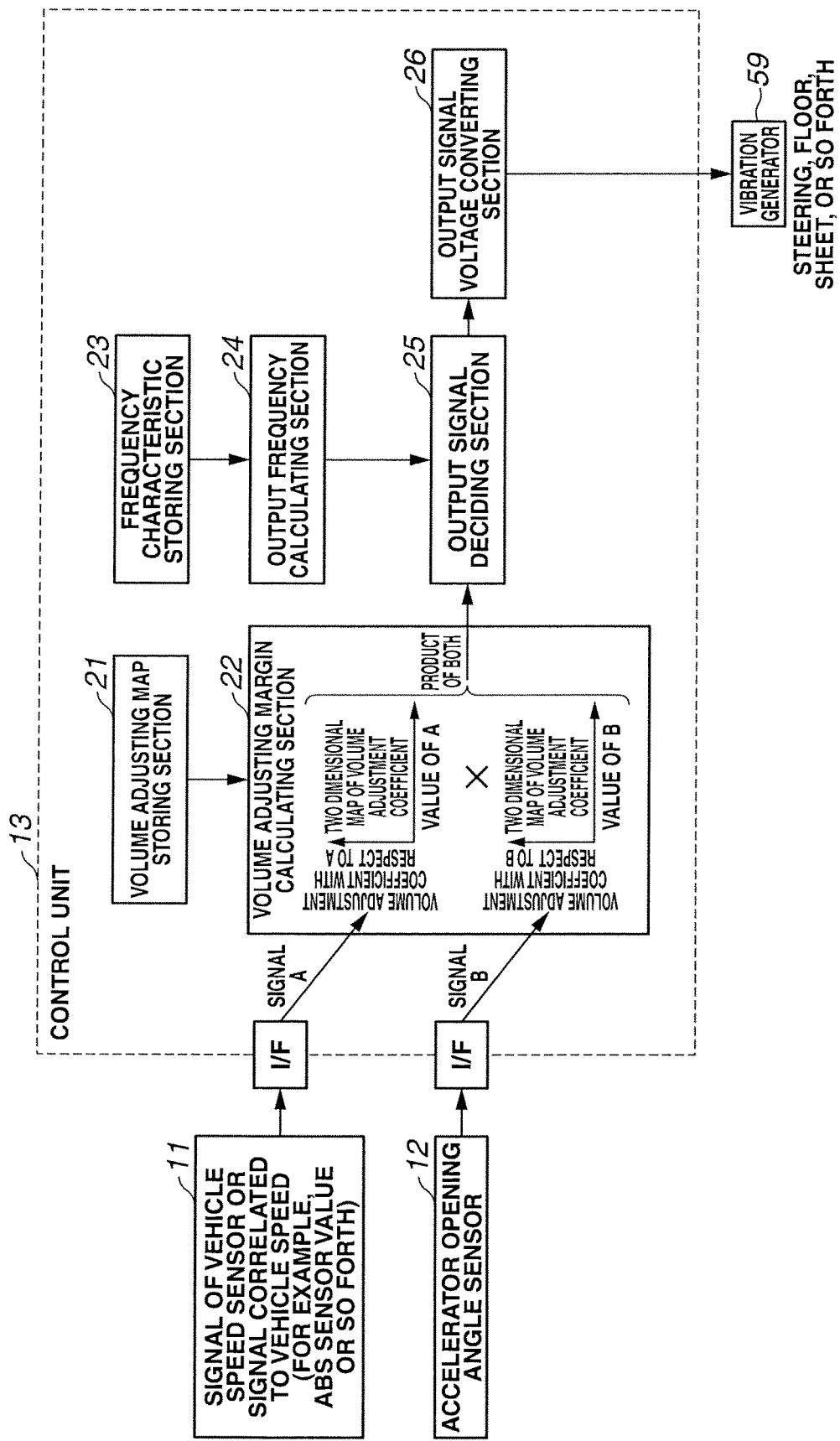

ACCELERATION INFORMATION TRANSMISSION DEVICE

TECHNICAL FIELD

The present invention relates to an acceleration information transmission device.

BACKGROUND ART

In a previously proposed technique of a Patent Document 1, a revolution frequency of an engine is reference signalized and a sound effect in accordance with the revolution frequency of the engine is outputted from an audio speaker and an acceleration time situation of a vehicle is transmitted to a driver of the vehicle by adjusting a sound pressure on a basis of a variation state of the revolution frequency of the engine.

As in the previously proposed technique described above, when the sound pressure is adjusted on a basis of only the variation state of the revolution frequency of the engine, in a vehicle which can be accelerated in a state in which a variation in an engine revolution number is small by means of, for example, a continuously variable transmission, it is difficult to accurately transmit the acceleration time situation such as an acceleration intention of the driver or an acceleration state of the vehicle.

A task of the present invention is to more accurately transmit the acceleration time situation such as the intention of the acceleration by the driver or the acceleration state of the vehicle.

PRE-PUBLISHED DOCUMENT

Patent Document 1: Japanese Patent No. 4173891

DISCLOSURE OF THE INVENTION

In order to solve the above-described task, while detecting an accelerator manipulated variable by a vehicle driver, a vehicle state which is an output of the vehicle is detected in accordance with an accelerator manipulated variable of the driver. Then, in accordance with the detected accelerator manipulated variable and the vehicle state, an acceleration information which represents at least one of the acceleration intention of the driver and the acceleration state of the vehicle is set and the set acceleration information is transmitted to the vehicle driver.

According to the acceleration information transmission device related to the present invention, a transfer degree of the acceleration time situation is adjusted from both points of the accelerator manipulated variable which provides the input (a cause) to the vehicle and the vehicle state which provides the output (result) of the vehicle accordingly. Hence, the acceleration time situation such as the acceleration intention of the vehicle driver and the acceleration state of the vehicle can more accurately be transmitted. That is to say, even in the vehicle in which the continuously variable transmission which indicates the small variation of the engine speed is mounted, the acceleration time situation such as the acceleration intention by the vehicle driver or the acceleration state of the vehicle can more accurately be transmitted.

BRIEF DESCRIPTION OF THE DRAWINGS

FIG. 24 is a system configuration view of the acceleration transmission device representing a twenty-third preferred embodiment.

EMBODIMENTS FOR CARRYING OUT THE INVENTION

Hereinafter, preferred embodiments of the present invention will be explained with reference to the drawings.

Figure 1:
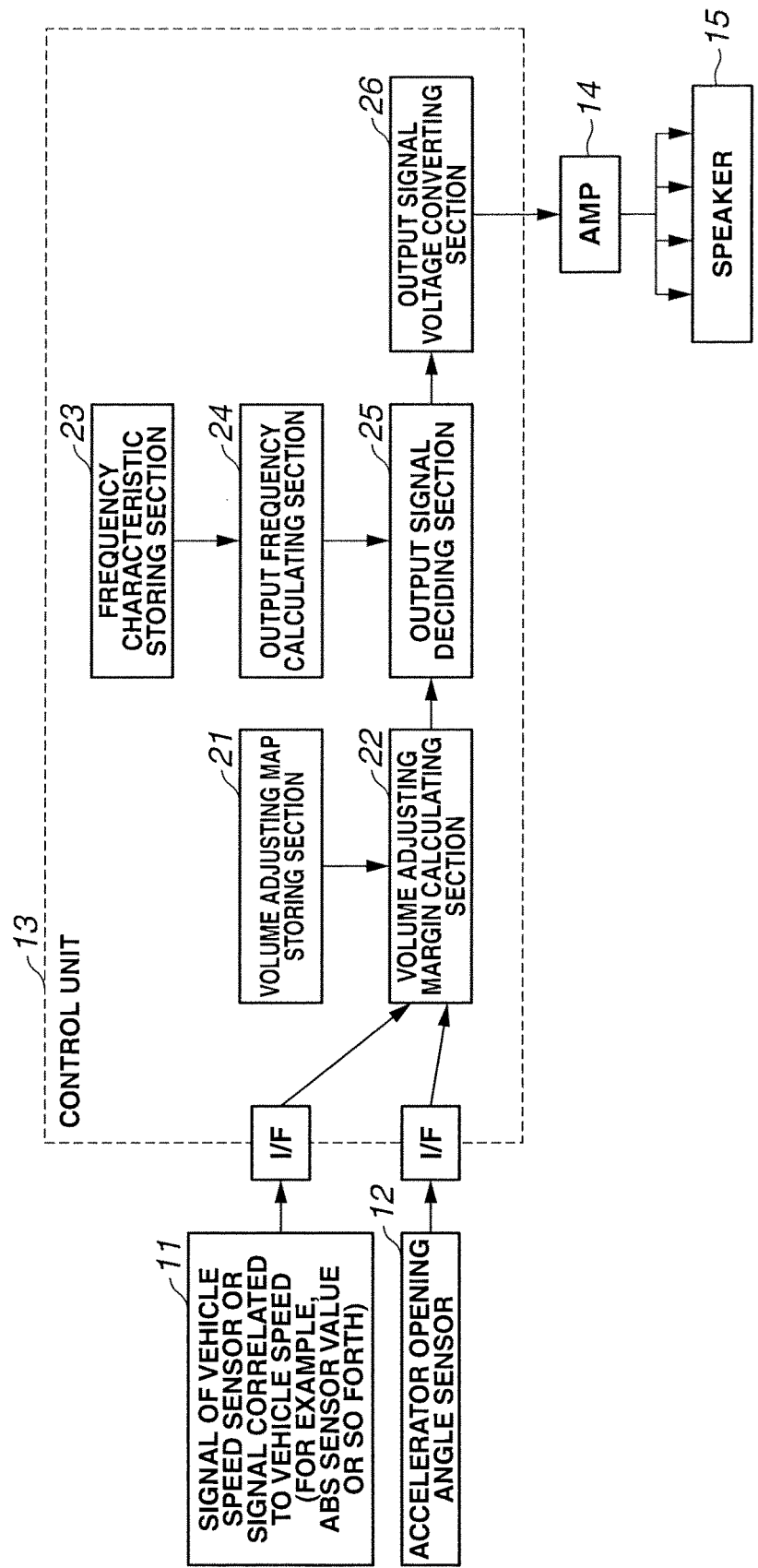
FIG. 1 is a configuration view of an acceleration information transmission device.

FIG. 1 is a system configuration view of an acceleration information transmission device.

In each of the preferred embodiments, a vehicle speed sensor 11 detecting a vehicle speed V, an accelerator opening angle sensor 12 detecting an accelerator opening angle APO, a control unit 13 constituted by, for example, a microcomputer, an amplifier 14, and a speaker 15.

Control unit 13 includes: a sound volume adjusting map storing section 21; a sound volume margin calculating section 22; a frequency characteristic storing section 23; an output frequency calculating section 24; an output signal deciding section 25; and an output signal voltage converting section 26.

Control unit 13 executes an acceleration time situation transmission control process and transmits the acceleration time situation to a vehicle driver by letting the driver hear about a sound whose volume is varied in accordance with the acceleration time situation (an acceleration intention). The sound volume is adjusted using two of volume adjustment coefficients, one being determined in accordance with a signal representing an accelerator opening angle by obtaining the accelerator opening angle and the other being determined in accordance with a signal having a correlation to a vehicle speed.

That is to say, the sound volume when a predetermined sound is outputted through a sound production device of the vehicle is adjusted using the signal representing the accelerator opening angle and the signal representing the signal correlated to the vehicle speed.

Thus, the acceleration time situation is transmitted to the driver with the sound volume by the sound combined with a sound having the degree components.

Next, an acceleration time situation transmission control process to be executed by control unit 13 whenever a predetermined (for example, 10 milliseconds) has passed will be explained below.

Figure 2:
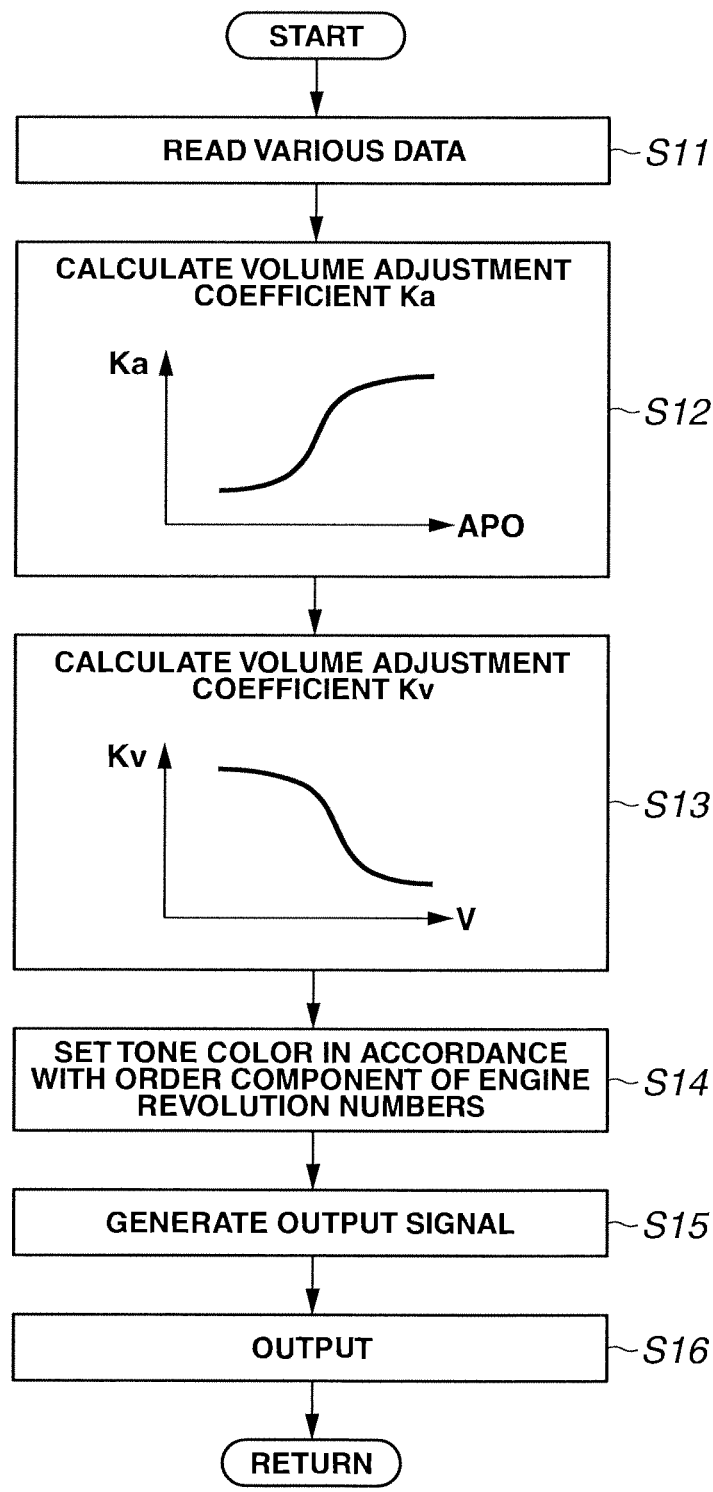
FIG. 2 is a flowchart representing an acceleration time situation transmission control process.

FIG. 2 is a flowchart representing the acceleration situation time transmission control process.

At a first step S11, control unit 12 reads various data. In the case of FIG. 2, vehicle speed V, accelerator opening angle APO, an engine revolution, and so forth are read.

At a step S12, control unit 12 refers to a control map and calculates a sound volume adjustment coefficient Ka in accordance with accelerator opening angle APO. This control map is set so that volume adjustment coefficient Ka becomes larger in a sigmoid (letter S shape) configuration, as accelerator opening angle APO becomes higher.

At the next step S13, the control map is referred to the control map and calculates volume adjustment coefficient Kv in accordance with vehicle speed V. The control map is set such that as vehicle speed V becomes higher, volume adjustment coefficient Kv becomes smaller in the sigmoid configuration (shape of letter S).

At the next step S14, a tone color in accordance with the degree components of the engine speed (engine revolution number) is set.

At the next step S15, control unit 13 generates an output signal in accordance with volume adjustment coefficients Ka and Kv and the degree components of the engine speed (engine revolution numbers). It should be noted that sound volume adjustment coefficients ka and kv are used to take a product thereof or to take a sum thereof.

At the next step S16, the voltage signal is voltage converted and outputted to amplifier 1 and the acceleration sound is outputted via a speaker 15.

At least one of the acceleration intention of the vehicle driver and the acceleration state of the vehicle is transmitted to the driver at the sound volume as the acceleration time situation.

It should be noted that it is difficult to accurately transmit the acceleration time situation such as the acceleration intention of the driver and the acceleration state of the vehicle in a vehicle which can be accelerated in a state in which the variation of the engine revolution numbers is small by means of, for example, the continuously variable transmission when the sound pressure is adjusted on a basis of the variation state of the revolution frequency of the engine.

Therefore, volume adjustment coefficient Ka is calculated in accordance with the coefficient map with respect to accelerator opening angle APO, volume adjustment coefficient kv is calculated in accordance with the coefficient map with respect to vehicle speed V, and the volume is adjusted in accordance with both of volume adjustment coefficients ka and kv.

As described above, since the degree of transmission of the acceleration time situation is adjusted from both faces of the accelerator manipulated variable which provides an input (cause) for the vehicle and the vehicle state which provides an output (result) of the vehicle, the acceleration time situation can accurately be transmitted. That is to say, even under a situation which the continuously variable transmission is mounted which gives a small variation in the change in the engine revolution speed, a more accurate transmission of the acceleration time situation such as the acceleration intention of the driver and the acceleration state of the vehicle can be made.

In addition, the acceleration time situation is transmitted to the driver at the volume with the combined sound with the sound of the degree components.

As described above, accelerator opening angle sensor 12 corresponds to "accelerator manipulated variable detecting means", vehicle speed sensor 11 corresponds to "vehicle state detecting means", amplifier 14, speaker 15, and the process at step S16 corresponds to "transmitting means", and control unit 13 corresponds to "acceleration information setting means".

The acceleration information transmission device in this embodiment detects accelerator opening angle APO which provides the input for the vehicle, detects the vehicle speed corresponding value which provides the output of the vehicle, adjusts the sound volume of the accelerator sound in accordance with accelerator opening angle APO and vehicle speed corresponding value, and transmits the adjusted sound volume of the acceleration sound to the driver.

Thus, the acceleration time situation such as the acceleration intention of the driver and the acceleration state of the vehicle can be transmitted to the vehicle driver with the sound which is the combination of the sound having the order components at the volume.

In this embodiment, a product or a sum of volume adjustment coefficient ka or kv is used to generate finally adjusted output signals. Weights of sound volume adjustment coefficients ka and kv are the same (a relationship of 1:1). However, mutually different weights may be set. In this case, if the weight of volume adjustment coefficient ka is relatively large, the acceleration intention of the driver can more strongly be reflected on the output signal. On the contrary, if the weight of volume adjustment coefficient ka is relatively made large, the acceleration state of the vehicle can more strongly be reflected. Hence, a scene in which the acceleration state of the vehicle is more strongly reflected and another scene in which the acceleration state of the vehicle is more strongly reflected are partitioned and the weighting is desirably varied dependent upon the traveling scene.

In this embodiment, volume adjustment coefficient ka is calculated in accordance with accelerator opening angle APO. However, in order to detect the acceleration intention of the driver in more details, the volume adjustment coefficient may be calculated in accordance with a variation speed (a differential value) of accelerator opening angle APO. That is to say, since the acceleration intention of the driver is different depending upon whether the driver slowly depresses the accelerator pedal or quickly depresses the accelerator pedal, the volume adjustment coefficient is calculated in accordance with the accelerator depression speed (manipulation speed) and a more detailed intention of the acceleration by the driver can be reflected by taking a product or sum of other volume adjustment coefficients ka and kv.

Figure 3:
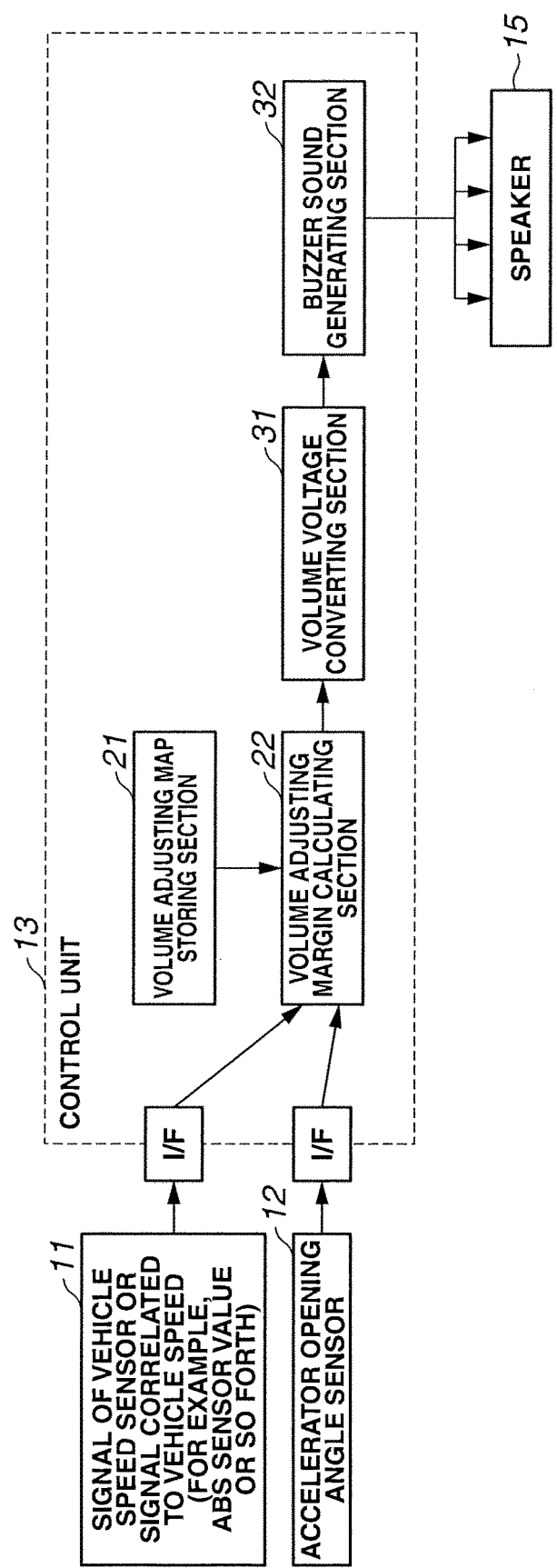
FIG. 3 is a system configuration view of the acceleration transmission device representing a second preferred embodiment.

FIG. 3 shows a system configuration view of the acceleration information transmission device in a second preferred embodiment. In this embodiment, a vehicle speed sensor 11, an accelerator opening angle sensor 12, a control unit 13, and a speaker 15 are equipped.

Control unit 13 includes: a volume adjusting map storing section 21; a volume adjusting margin calculating section 22; a volume voltage converting section 31; and a buzzer sound generating section 32.

In this embodiment, a buzzer sound is generated within control unit 13. A sound quality is as follows: With a buzzer sound fixed, the output is carried out at the volume adjusted in the same manner as the first embodiment. That is to say, the predetermined sound is the buzzer sound. For example, a magnitude of the volume is determined depending upon the magnitude of a voltage.

The setting of the volume for the acceleration time situation such as the intention of acceleration of the driver or the acceleration state of the vehicle is the same as the first embodiment. The sound quality is the buzzer sound and the buzzer sound is generated within the control unit.

In this way, the volume sound of the buzzer can transmit the acceleration time situation such as the acceleration intention of the driver or the acceleration state of the vehicle to the driver as described above. Hence, if the buzzer is such that the volume is varied in accordance with the variation of voltage, the acceleration transmission can inexpensively be realized.

The acceleration information transmission device in the embodiment described above has a feature such that the acceleration sound of the vehicle can be transmitted to the driver by means of the predetermined buzzer. Thus, with the sound volume of the buzzer, the acceleration time situation such as the acceleration intention of the driver or the acceleration state of the vehicle can be transmitted to the driver. As described above, if the buzzer such that the volume is varied in accordance with the change in the voltage is used, the acceleration transmission can inexpensively be realized.

Figure 4:
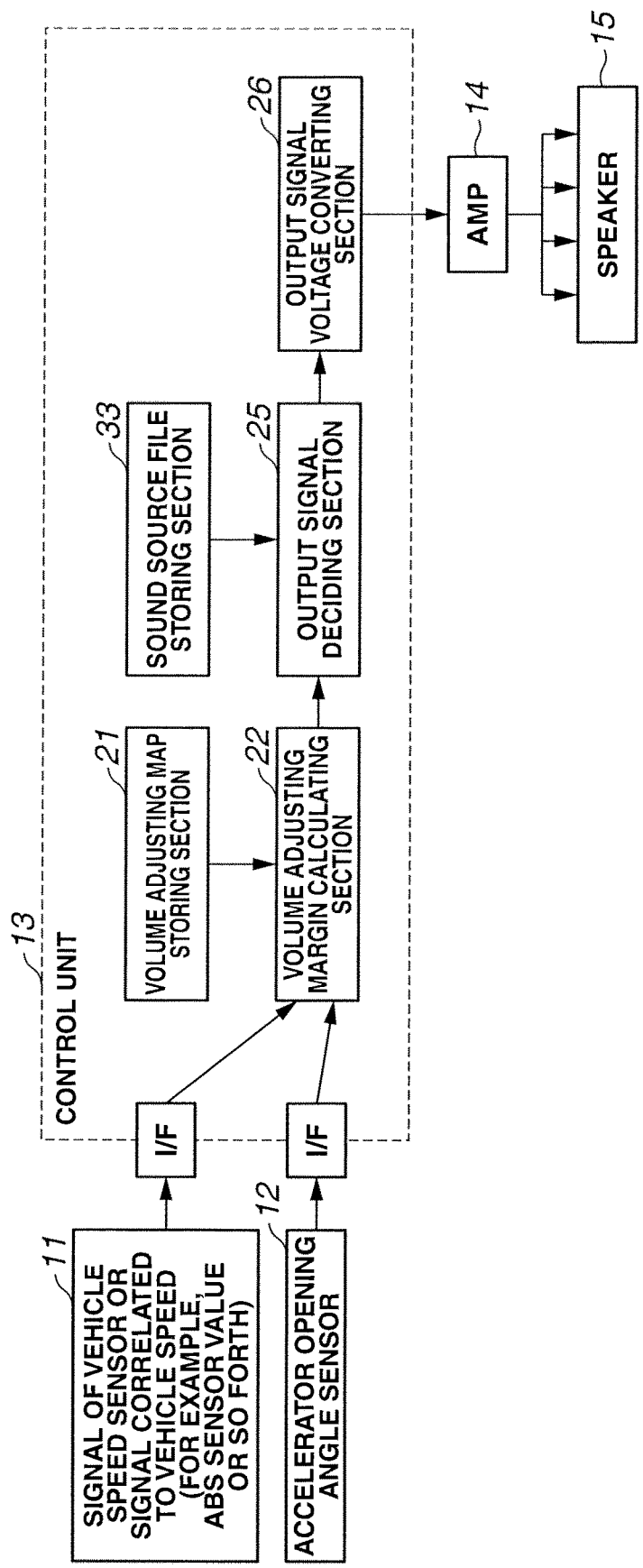
FIG. 4 is a system configuration view of the acceleration transmission device representing a third preferred embodiment.

FIG. 4 shows a system configuration view of the acceleration information transmission device representing a third preferred embodiment.

In this embodiment, vehicle speed sensor 11, accelerator opening angle sensor 12, control unit 13, amplifier 14, and speaker 15 are equipped.

Control unit 13 includes: volume adjusting map storing section 21, volume adjusting margin calculation section 22, a sound source file storing section 33; an output signal determining section 25; and an output signal voltage converting section 26.

In this embodiment, data of way file is stored in control unit 13 and is outputted at the volume adjusted in the same technique as described above.

That is to say, the predetermined sound corresponds to a sound source data (way file, midi file, and so forth) recorded within control unit 13.

The setting of the sound volume for the acceleration time situation such as the acceleration intention of the driver and the acceleration state of the vehicle is the same as the first embodiment. The sound quality is prescribed (fixed sound quality) such as way and so forth.

As described above, the sound quality is prescribed by way file present by a user and the acceleration time situation such as the acceleration intention of the driver and the acceleration state of the vehicle is transmitted to the driver at the volume of that sound so that a quality feeling can be improved as compared with the buzzer. In addition, a more approximate sound to inform the acceleration time situation such as the acceleration intention of the driver or the acceleration state of the vehicle can be made.

The acceleration information transmission device in this embodiment has a feature such that the acceleration sound of the vehicle is transmitted to the driver by means of the sound source data pre-stored.

As described above, the sound quality is prescribed by means of the way file preset by the user and the acceleration time situation such as the acceleration intention of the driver and the acceleration state of the vehicle at the volume of that sound can be transmitted to the driver so that the quality feeling can be improved as compared with the buzzer. In addition, the more appropriate sound to inform the acceleration time situation such as the acceleration intention of the driver or the acceleration state of the vehicle can be made.

Figure 5:
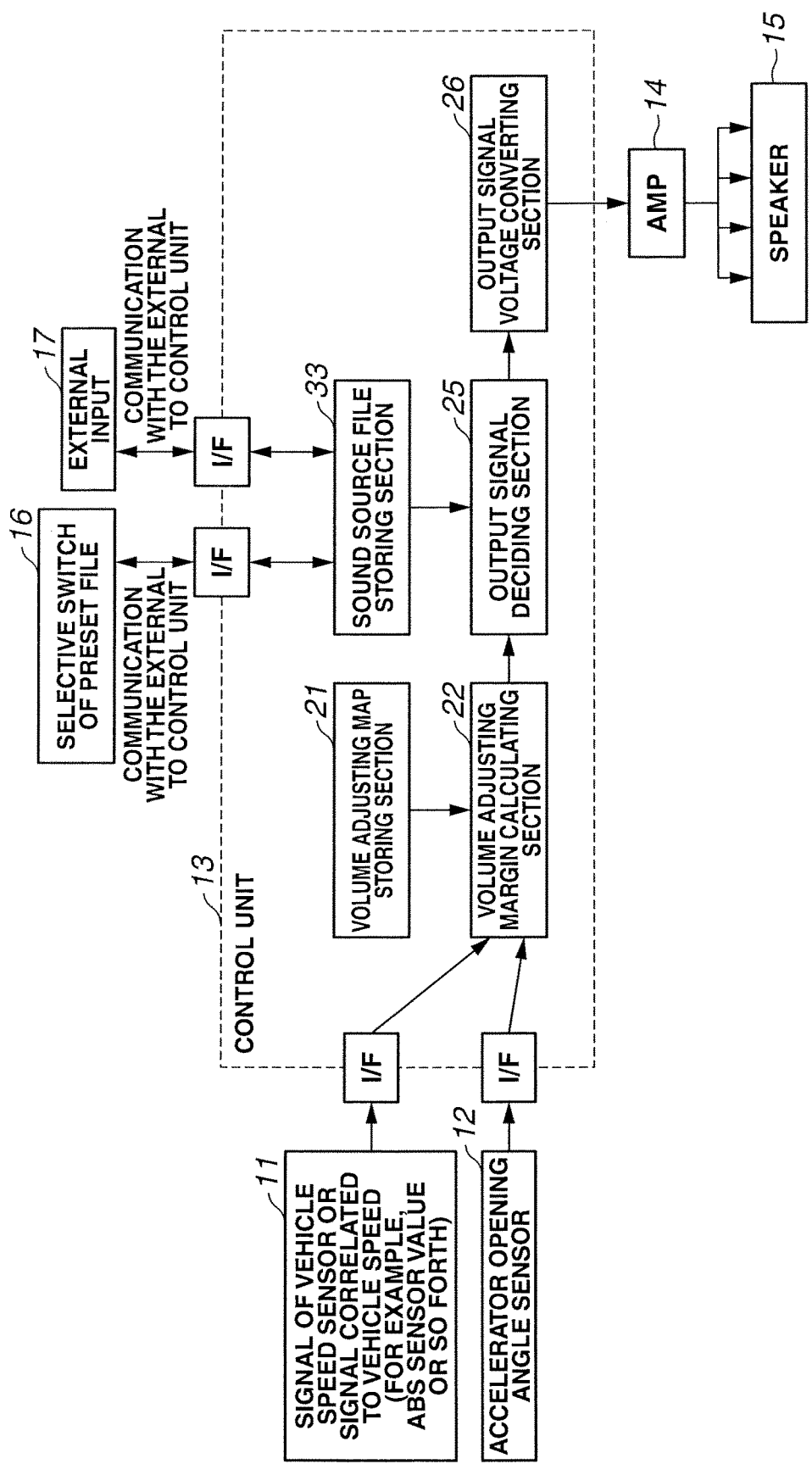
FIG. 5 is a system configuration view of the acceleration transmission device representing a fourth preferred embodiment.

FIG. 5 is a system configuration view of the acceleration transmission device representing a fourth preferred embodiment.

In this embodiment, vehicle speed sensor 11, accelerator opening angle sensor 12, control unit 13, amplifier (AMP) 14, speaker 15, preset file selection switch 16, and an external outout.17 are equipped.

Control unit 13 includes: volume adjusting map storing section 21; volume adjusting margin calculating section 22; sound source adjusting file storing section 33; output signal deciding section 25; and output signal voltage converting section 26.

It is possible to modify the sound source data. The modification by means of an external terminal such as USB and preset file can be selected.

That is to say, the sound source data stored within the control unit is rewritable.

A modification function of the sound source file is added. That is to say, the rewriting in a present USB communications becomes possible. The setting such as a sound volume is the same as the first embodiment.

In this way, a more appropriate sound can be used in accordance with a preference of the driver, a cultural background, an aural characteristic, and so forth.

Figure 6:
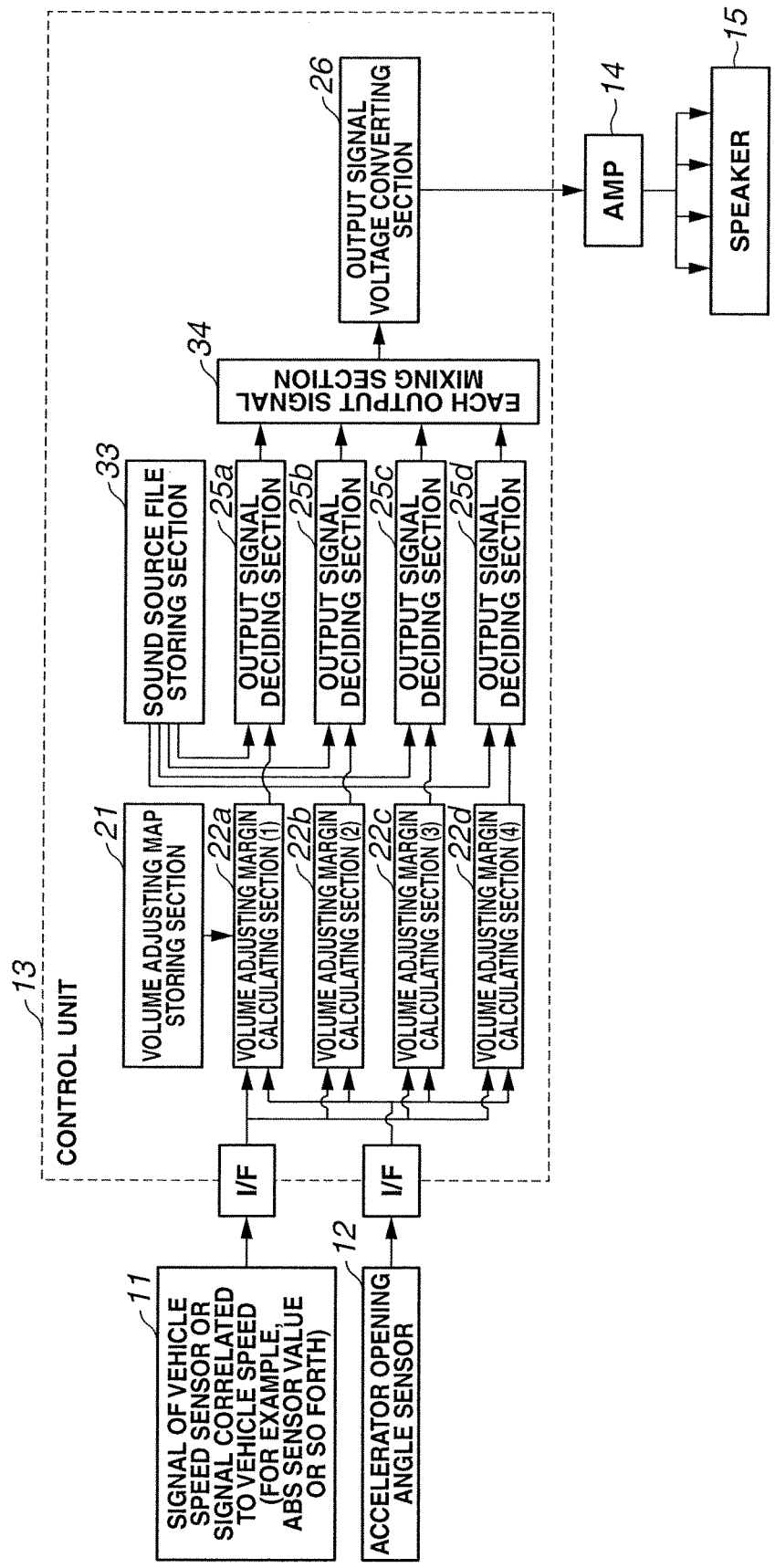
FIG. 6 is a system configuration view of the acceleration transmission device representing a fifth preferred embodiment.

FIG. 6 shows a system configuration view representing a fifth preferred embodiment. In this embodiment, vehicle speed sensor 11, accelerator opening angle sensor 12, control unit 13, amplifier 14, and speaker 15 are equipped. Control unit 13 includes: volume adjusting map storing section 21, volume adjusting margin calculating sections 22a through 22d, sound source file storing section 33, output signal deciding sections 25a through 25d, respective output signal mixing section 34, and output signal voltage converting section 26.

A plurality of sound sources are set and the volume of each of the respective sound sources is controlled independently of each other. The volume control map is individually retained and controlled for each of the sound sources so that it is possible to modify weighting for each of the sound sources with the single volume control map.

That is to say, a plurality of sound source data are installed so that each of the sound source data can be volume controlled independently of each other.

Several sound source data are provided and the contents of the volume control can be prescribed for each of the files.

In this way, the plurality of sound sources are volume controlled individually so that a finer vehicular information can be transmitted to the driver.

The acceleration information transmission device in this embodiment can be transmitted to the driver. The acceleration transmission device in this embodiment has a feature such that the acceleration sound of the vehicle can be transmitted to the driver by means of at least one of the plurality of sound source data pre-stored.

In this way, the plurality of sound sources are individually volume controlled so that finer vehicle information can be transmitted to the driver.

Figure 7:
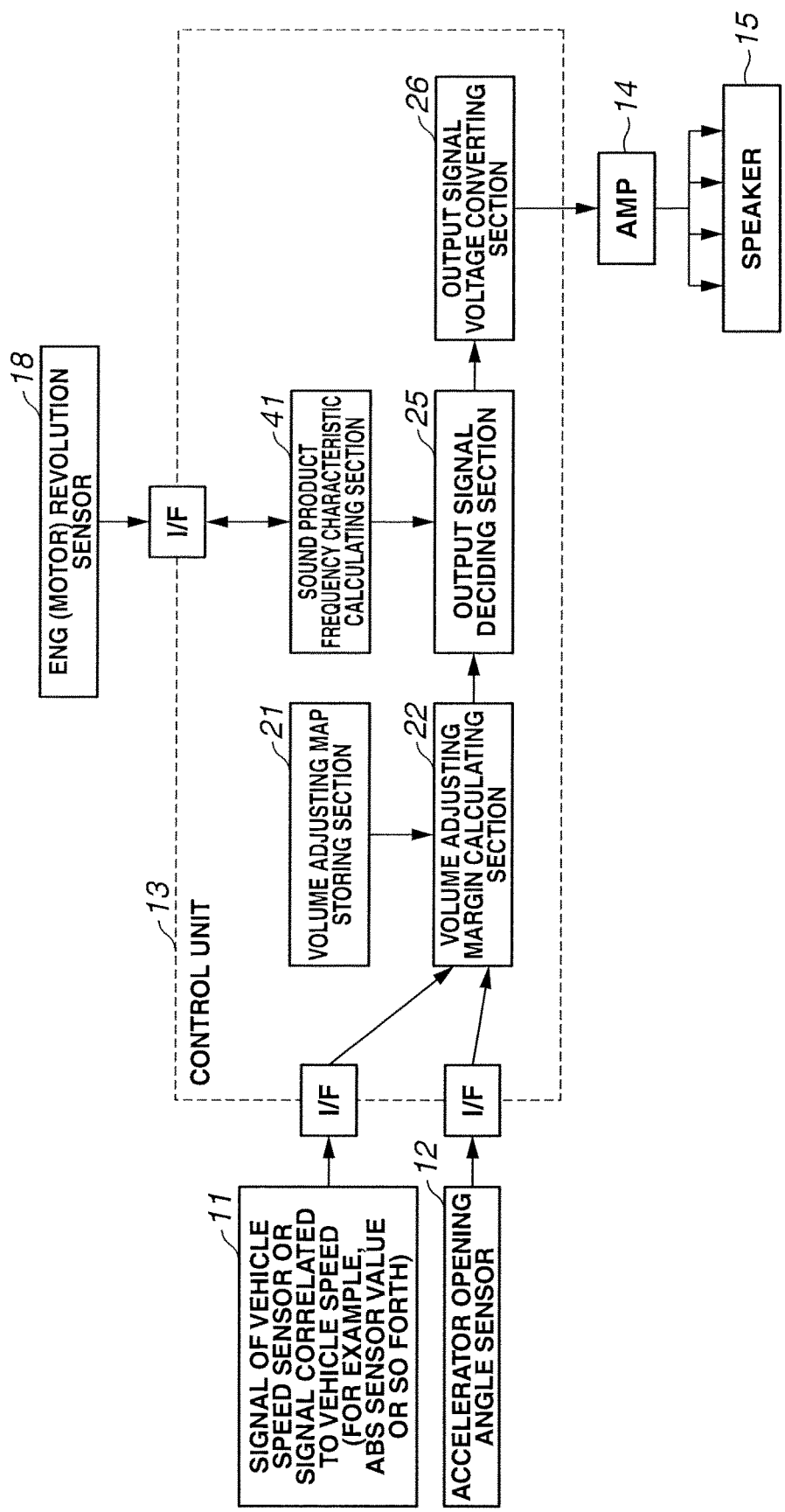
FIG. 7 is a system configuration view of the acceleration transmission device representing a sixth preferred embodiment.

FIG. 7 shows a system configuration view of the acceleration information transmission device representing a sixth preferred embodiment.

In this embodiment, vehicle speed sensor 11, accelerator opening angle sensor 12, control unit 13, amplifier 14, speaker 15, and engine (speed) revolution sensor 18 detecting the engine revolution number (speed).

Control unit 13 includes: volume adjusting map storing section 21: volume adjusting margin calculating section 22; a sound product (or production) frequency characteristic calculating section 41; output signal deciding section 25; and output signal voltage converting section 26.

The sound source is generated within control unit 13 and, at this time, can be generated on a basis of the reference to the engine revolution and the motor revolution signal. It is possible to calculate the revolution information by obtaining a digital signal through CAN or by obtaining an analog signal of a rectangular wave. That is to say, the predetermined sound is generated within control unit 13 by referring to the engine revolution, the motor revolution, and the vehicle speed. This is not limited to the pulse but also may be possible in the information such as the CAN signal.

The acceleration information transmission device has the function to prescribe a change in the tone color in accordance with the engine revolution, the motor revolution, and the vehicle speed.

In this way, the sound is generated by referring to the vehicle state related to the acceleration such as the engine revolution number and the vehicle speed. Thus, a combination of the acceleration time situation and the vehicle state can be transmitted to the driver. In addition, during the acceleration, a natural feeling as the sound hearing in a compartment at the time of the acceleration can be obtained.

The acceleration information transmission device in this embodiment has a feature such that a frequency characteristic of the acceleration sound is adjusted in accordance with the engine revolution number.

In this way, the sound is created by referring to the vehicle state related to the acceleration of the engine revolution number and the vehicle speed so that a combination of the acceleration time situation and the vehicle state can be transmitted to the driver. The natural feeling can be obtained as the sound hearing within the compartment at the time of acceleration.

Figure 8:
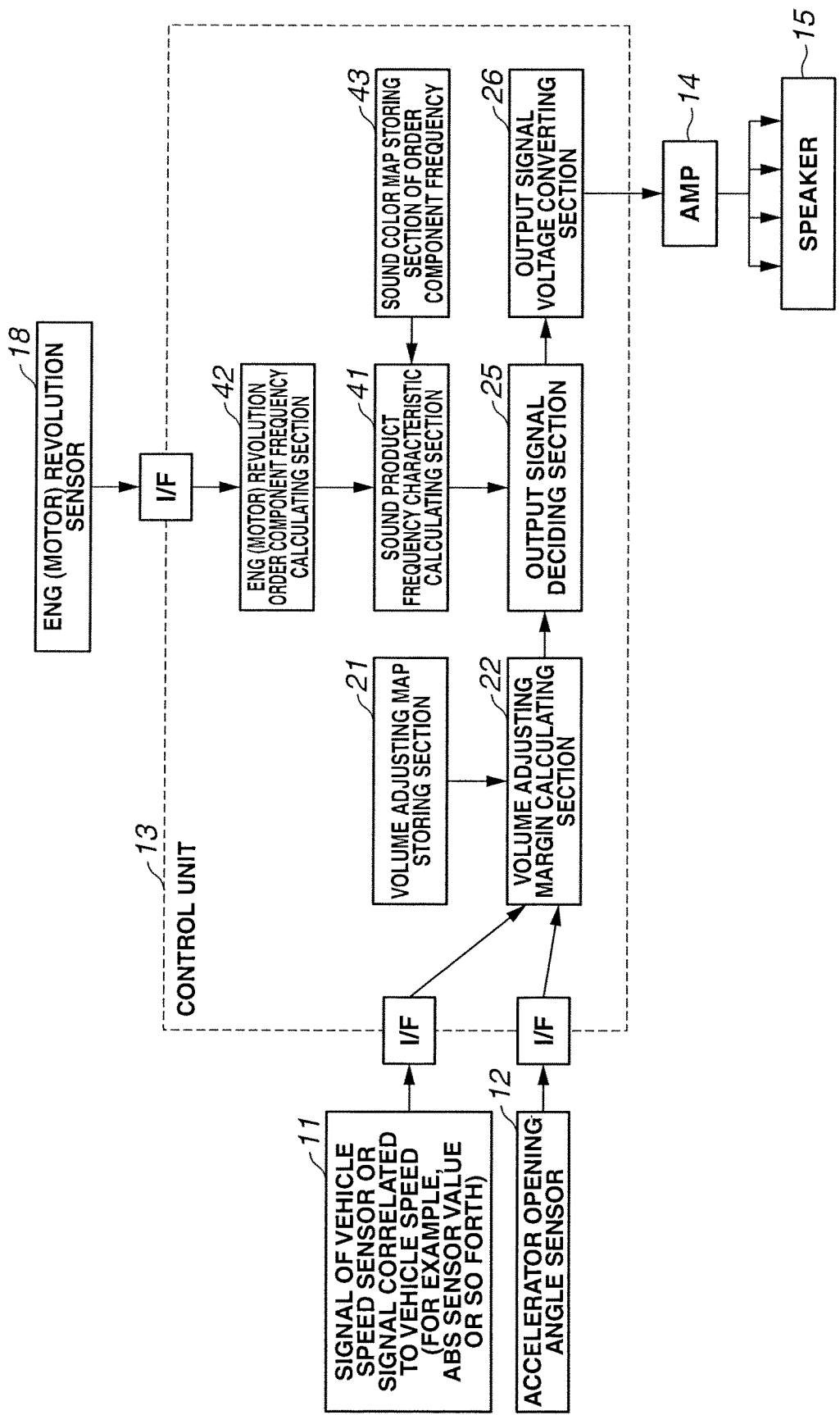
FIG. 8 is a system configuration view of the acceleration transmission device representing a seventh preferred embodiment.

FIG. 8 shows a system configuration view of the acceleration information transmission device representing a seventh preferred embodiment.

In this embodiment, vehicle speed sensor 11, accelerator opening angle sensor 12, control unit 13, amplifier 14, and speaker 15, and engine revolution sensor 18 are equipped.

Control unit 13 includes: volume adjusting map storing section 21, volume adjusting margin calculating section 22, sound product (or production) frequency characteristic calculating section 41, engine revolution order component frequency calculating section 42, a tone color map storing section 43 of the order component frequencies, an output signal deciding section 25, and output signal voltage converting section 26.

The sound color is determined on a basis of the revolution signal in the same way as the above-described manner.

In addition, a logic to decide the tone color by calculating the revolution order component frequency on a basis of the revolution signal is provided. That is to say, the predetermined sound is generated as the order components of the engine revolution, the motor revolution, and the vehicle speed.

The acceleration information transmission device has the function to generate the tone color with the order components from the engine revolution, the motor revolution, and the vehicle speed.

In this way, the acceleration time situation and the vehicle state can more accurately be transmitted by interlocking the engine speed and the vehicle speed with the frequency of the sound. The acceleration time situation and the vehicle state can more accurately be transmitted by interlocking the engine revolution number and the vehicle speed with the frequency of sound.

The acceleration time situation transmission device in this embodiment has the feature to adjust the frequency characteristic of the acceleration sound in accordance with the order components of the engine revolution number.

In this way, by interlocking the engine revolution speed and the vehicle speed and the frequency of sound the acceleration time situation and the vehicle state can be transmitted.

Figure 9:
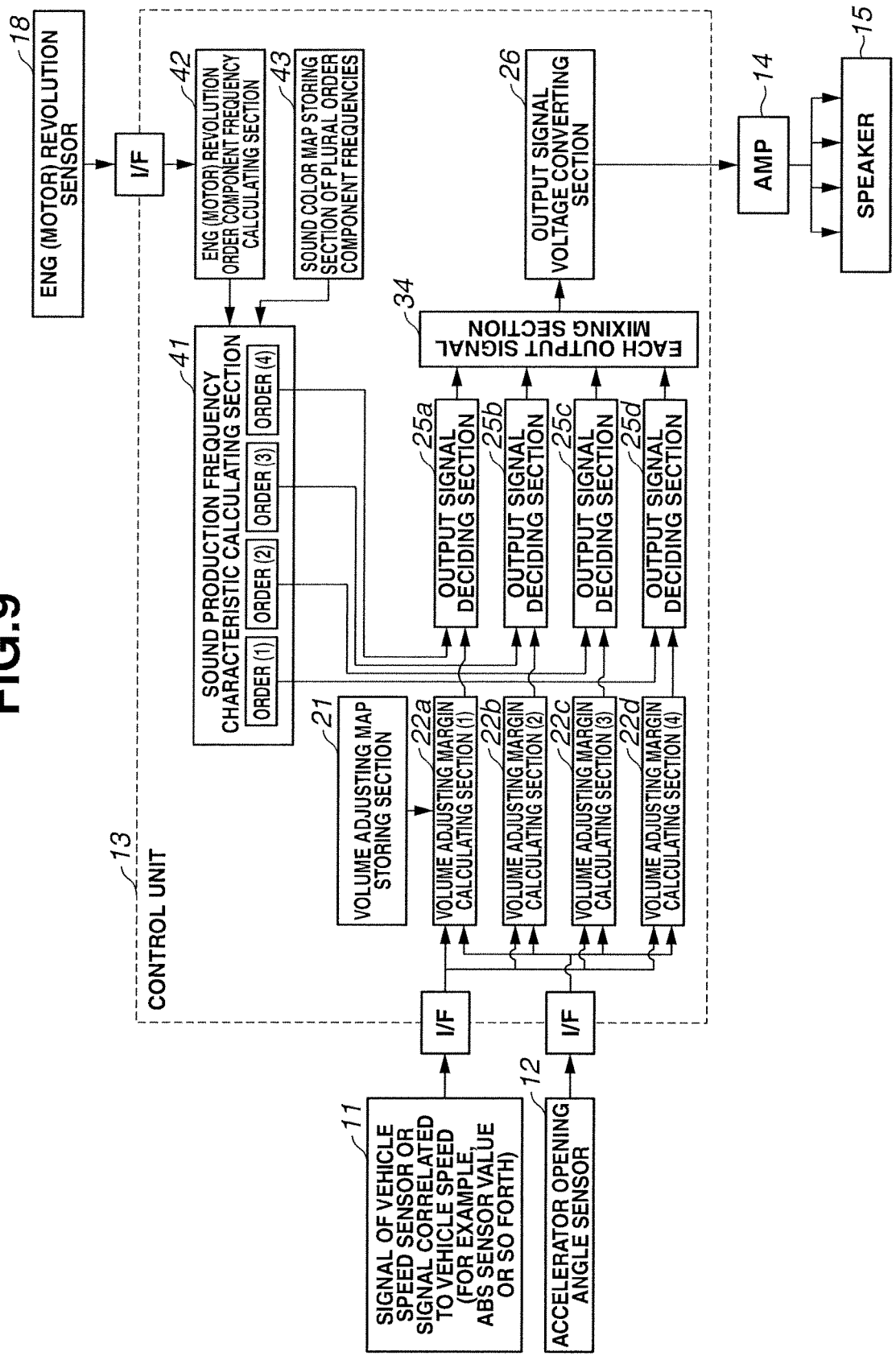
FIG. 9 is a system configuration view of the acceleration transmission device representing an eighth preferred embodiment.

FIG. 9 shows a system configuration view of the acceleration information transmission device representing an eighth preferred embodiment.

In this embodiment, vehicle speed sensor 11, accelerator opening angle sensor 12, control unit 13, amplifier 14, and engine (motor) revolution sensor 18 are equipped.

Control unit 13 includes: volume adjusting map storing section 21, volume adjusting margin calculating sections 22a through 22d, sound product (or production) frequency characteristic calculating sections 41a through 41d, engine revolution order component frequency calculating section 42, tone color map storing section 43 of the order component frequency; output signal deciding sections 25a through 25d, respective output signal mixing sections 34, and output signal mixing sections 34, and output signal voltage converting section 26.

In the same way as described above, the plurality of tone colors of the revolution order components can be generated and outputted.

That is to say, the predetermined sound is plurally generated as the order components of the engine revolution and the vehicle speed and the volumes of respective orders are independently adjusted.

The acceleration information transmission device Has a function to generate the tone color of the order components from the engine revolution, the motor revolution, and the vehicle speed. This order component can plurally be generated and its sound can simultaneously or selectively outputted.]

In this way, the acceleration intention of the driver and the acceleration state of the vehicle can be expressed depending upon the difference in the sound quality.

The acceleration information transmission device in this embodiment has a feature such that a frequency characteristic of the acceleration sound is adjusted in accordance with a plurality of order components of the engine revolution number.

In the way described above, since the volume is adjusted by independently controlling respective order components, the acceleration time situation such as the acceleration intention of the driver and the acceleration state of the vehicle can be represented even if there is significant difference in the sound quality.

Figure 10:
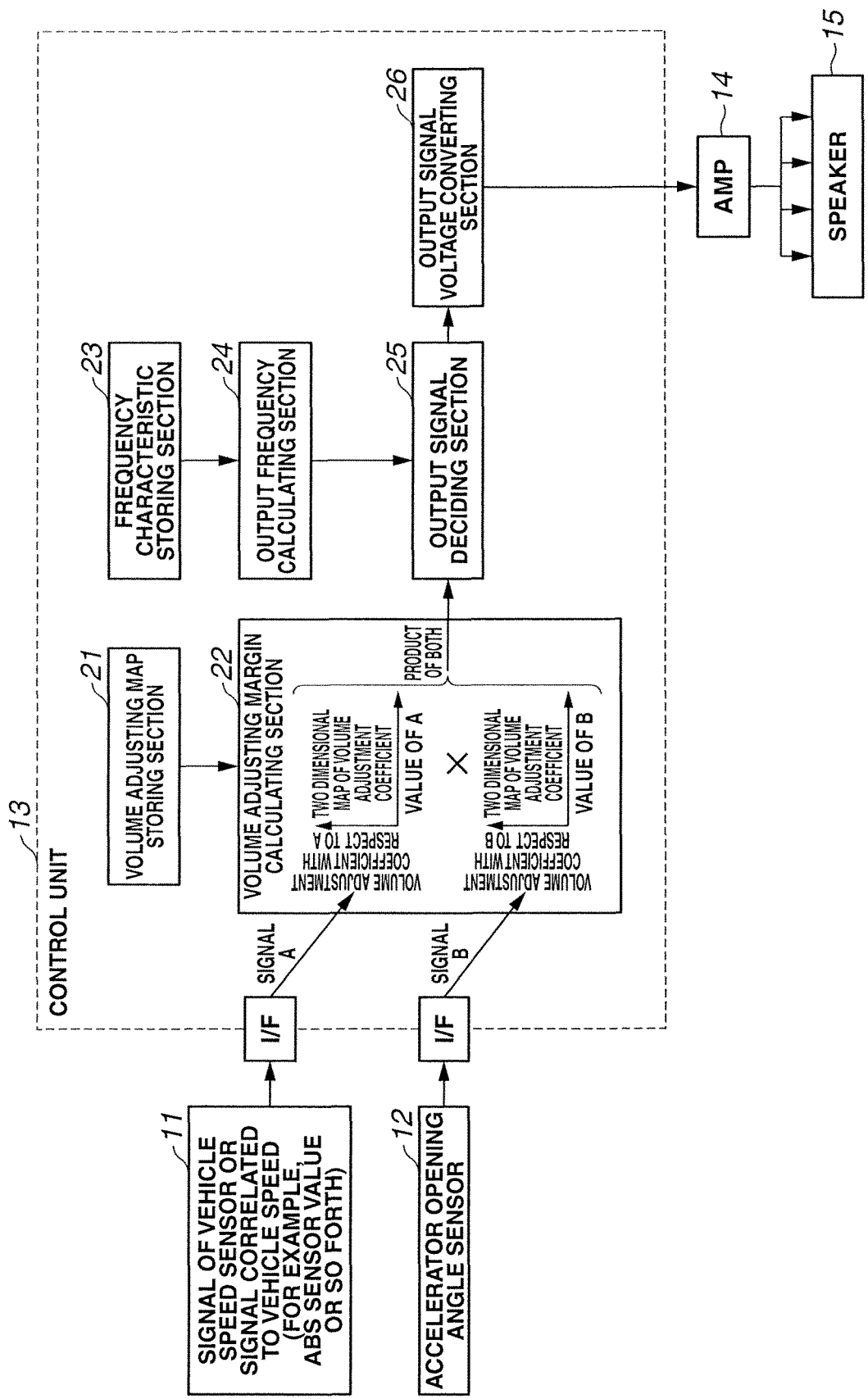
FIG. 10 is a system configuration view of the acceleration transmission device representing a ninth preferred embodiment.

FIG. 10 shows a system configuration view of the acceleration information transmission device representing a ninth preferred embodiment.

In this embodiment, vehicle speed sensor 11, accelerator opening angle sensor 12, control unit 13, amplifier 14, and speaker 15 are equipped.

Control unit 13 includes: volume adjusting map storing section 21, volume adjusting margin calculating section 22, frequency characteristic storing section 23, output frequency calculating section 24, output signal deciding section 25, and output signal voltage converting section 26.

Two maps of the volume adjusting map which accords with accelerator opening angle APO and volume adjusting map in accordance with the signal correlated to the vehicle speed are provided and a product of volume adjustment coefficient ka and kv is calculated by respective maps by obtaining the signal having a correlation between accelerator opening angle APO and the vehicle speed. The product is recognized by the coefficient at the acceleration time situation and the volume is controlled in accordance with the coefficient.

That is to say, the volume is determined according to a product between a value determined by the map of accelerator opening angle APO and a value determined by the map of the signal correlated to the vehicle speed.

A volume map which accords with accelerator opening angle APO is retained within the control unit.

In addition, the volume map which accords with the vehicle speed is retrained within the control unit.

By having a function to calculate the product between both and having a function to perform the volume control according to the result thereof, the volume control with the acceleration time situation taken into consideration can be achieved.

As described above, with the signal having the correlation between the accelerator opening angle APO signal and the signal having the correlation to the vehicle speed always secured, the acceleration time situation such as the acceleration intention of the driver and the acceleration state of the vehicle can be calculated. In addition, this result is reflected on the volume of the actually outputted sound. The acceleration time situation such as the acceleration intention of the driver and the acceleration state of the vehicle can be recognized at a real time basis by the driver.

The acceleration information transmission device in this embodiment has a feature such that the volume of the acceleration sound which accords with accelerator opening angle APO and the volume of the acceleration sound which accords with the vehicle speed corresponding value are calculated and the product of both adjusts the final acceleration sound.

Figure 11:
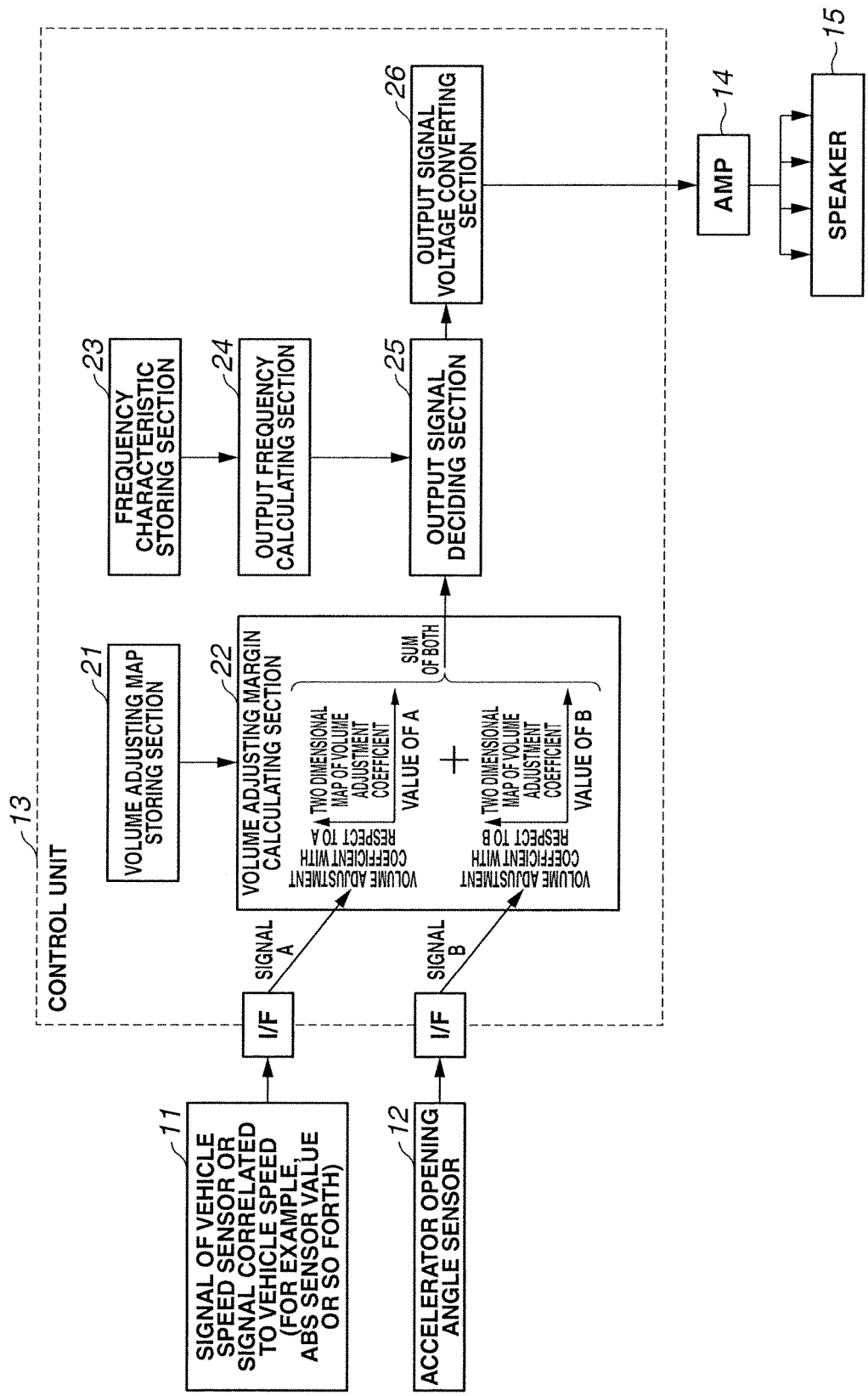
FIG. 11 is a system configuration view of the acceleration transmission device representing a tenth preferred embodiment.

FIG. 11 shows a system configuration view of the acceleration information transmission device in a tenth preferred embodiment.

In this embodiment, vehicle speed sensor 11, accelerator opening angle sensor 12, control unit 13, amplifier 14, and speaker 15 are equipped.

Control unit 13 includes: volume adjusting map storing section 21; volume adjusting margin calculating section 22; frequency characteristic storing section 23; output frequency calculating section 24; output signal deciding section 25; and output signal voltage converting section 26.

Two maps of volume adjusting map which accords with accelerator opening angle APO and the volume adjusting map which accords with the signal having the correlation to the vehicle speed are provided. By obtaining accelerator opening angle APO signal and the signal having the correlation to the vehicle speed, a sum of respective volume adjustment coefficients ka, kv calculated from respective maps is calculated. The sum is recognized as the coefficient at the time of acceleration time situation and the volume is controlled in accordance with the coefficient.

That is to say, the volume is decided in accordance with the sum of the value determined by the map of accelerator opening angle APO and the value determined by the map of the signal having the correlation to the vehicle speed.

The volume map which accords with accelerator opening angle APO is provided within the control unit. The volume map which accords with accelerator opening angle APO is provided within the control unit. In addition, the volume map which accords with the vehicle speed is provided within the control unit.

Then, the volume control with the acceleration time situation such as the acceleration intention of the driver and the acceleration state of the vehicle taken into consideration can be made possible by providing the calculation of the sum of both and providing the function to perform the volume control according to the result of the sum. In this way, the signal of accelerator opening angle APO and the signal having the correlation to the vehicle speed are always secured, the acceleration time situation such as the acceleration intention of the driver on the real time basis or the acceleration state of the vehicle can be recognized by the driver.

The acceleration information transmission device in this embodiment has such a feature that the volume of the acceleration sound which accords with accelerator opening angle APO and the volume of the acceleration sound which accords with the vehicle speed corresponding value are calculated and the volume is adjusted to a final acceleration sound volume according to the sum of both. In this way, the signal of accelerator opening angle APO and the signal correlated to the vehicle speed are always secured and the acceleration time situation such as the acceleration intention of the driver and the acceleration state of the vehicle can be calculated from both signals.

In addition, the result of the calculation is reflected on the volume of the actually outputted sound so that the acceleration time situation such as the acceleration intention of the driver and the acceleration state of the vehicle can be recognized by the driver.

Figure 12:
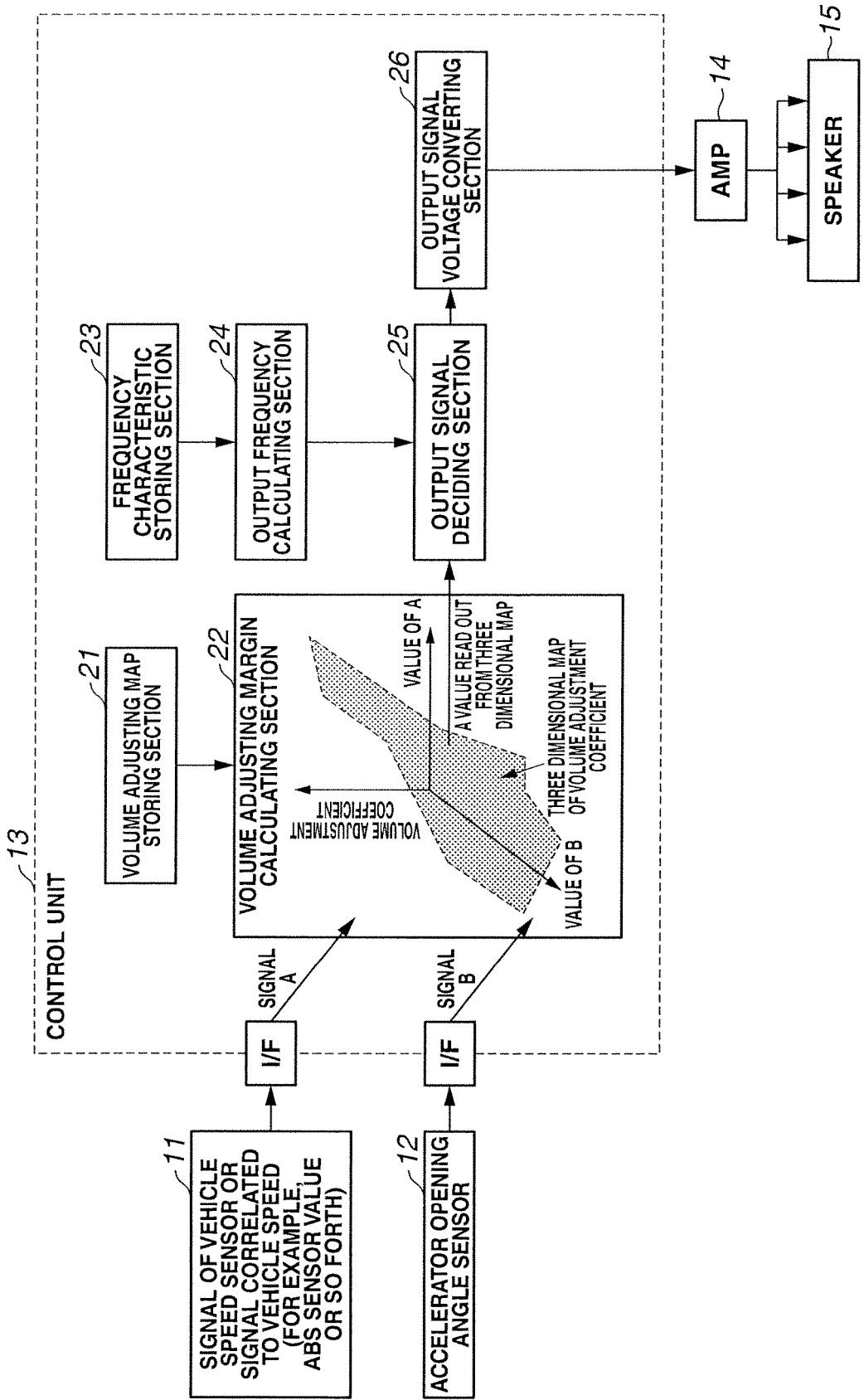
FIG. 12 is a system configuration view of the acceleration transmission device representing an eleventh preferred embodiment.

FIG. 12 shows a system configuration view of the acceleration information transmission device representing an eleventh preferred embodiment.

In this embodiment, vehicle speed sensor 11, accelerator opening angle sensor 12, control unit 13, amplifier 14, and speaker 15 are equipped.

Control unit 13 includes: volume adjusting map storing section 21; volume adjusting margin calculating section 22; frequency characteristic storing section 23; output frequency calculating section 24; output signal deciding section 25; and output signal voltage converting section 26. A three dimensional map with accelerator opening angle APO, the signal having the correlation to the vehicle speed, and the volume adjustment coefficient as axes is provided and the volume is controlled in accordance with the three dimensional map derived volume adjustment coefficient.

That is to say, the three dimensional map determined by two parameters of accelerator opening angle APO and the signal having the correlation to the vehicle speed are used.

The three dimensional volume map which accords with accelerator opening angle APO and the vehicle speed is provided within the control unit. By providing the function to perform the volume control according to the result, the volume control with the acceleration time situation such as the acceleration intention of the driver and the acceleration state of the vehicle can be calculated from both of the signals. In addition, the result is reflected on the volume of the actually outputted sound so that the acceleration time situation such as the acceleration intention of the driver and the acceleration state of the vehicle can be recognized by the driver on the real time basis.

The acceleration information transmission device in this embodiment has a feature such that the device refers to the three-dimensional map by which the volume of the acceleration sound is defined in accordance with accelerator opening angle APO and the vehicle speed corresponding value.

In this way, accelerator opening angle APO signal and the signal having the correlation to the vehicle speed are always secured and the acceleration time situation of the acceleration intention of the driver and the acceleration state of the vehicle can be calculated from both of the signals. In addition, the result of the calculation is reflected on the volume of the actually outputted sound on the real time basis.

Figure 13:
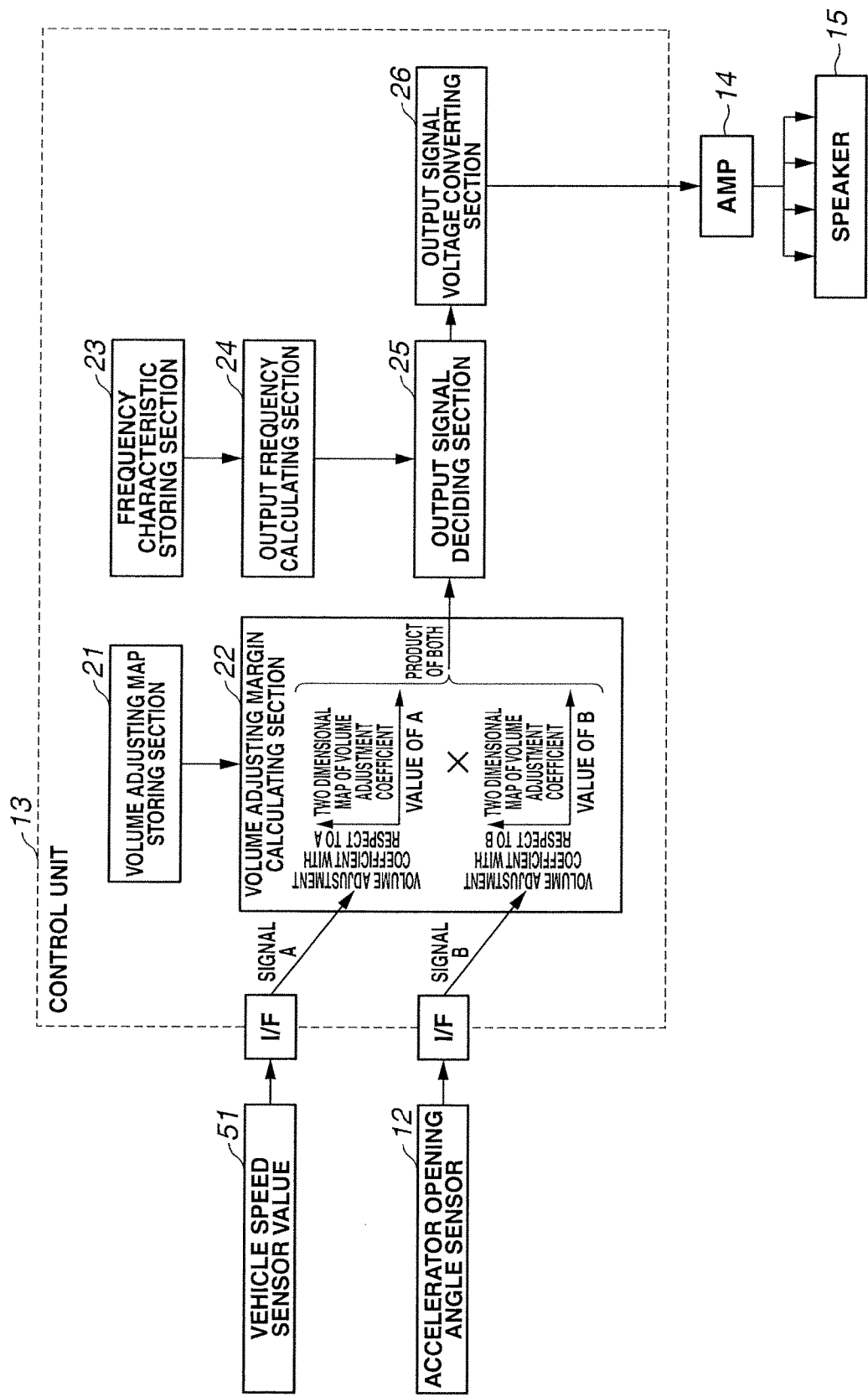
FIG. 13 is a system configuration view of the acceleration transmission device representing a twelfth preferred embodiment.

FIG. 13 shows a system configuration view of the acceleration information transmission device representing a twelfth preferred embodiment.

In this embodiment, vehicle speed sensor 11, accelerator opening angle sensor 12, control unit 13, amplifier 14, and speaker 15 are equipped.

Control unit 13 includes: volume adjusting map storing section 21; volume adjusting margin calculation section 22; frequency characteristic storing section 23; output frequency calculating section 24; output signal deciding section 25, and output signal voltage converting section 26. The volume is controlled using the signal having the correlation to the vehicle speed, namely, the vehicle speed signal itself. That is to say, the signal having the correlation to the vehicle speed in this embodiment is the vehicle speed itself.

The above-described map should be referred to by means of the vehicle speed itself.

As described above, an accuracy can be increased by using the vehicle speed itself.

The acceleration information transmission device in this embodiment detects the vehicle speed. In this way, the accuracy can be improved by using the vehicle speed itself.

Figure 14:
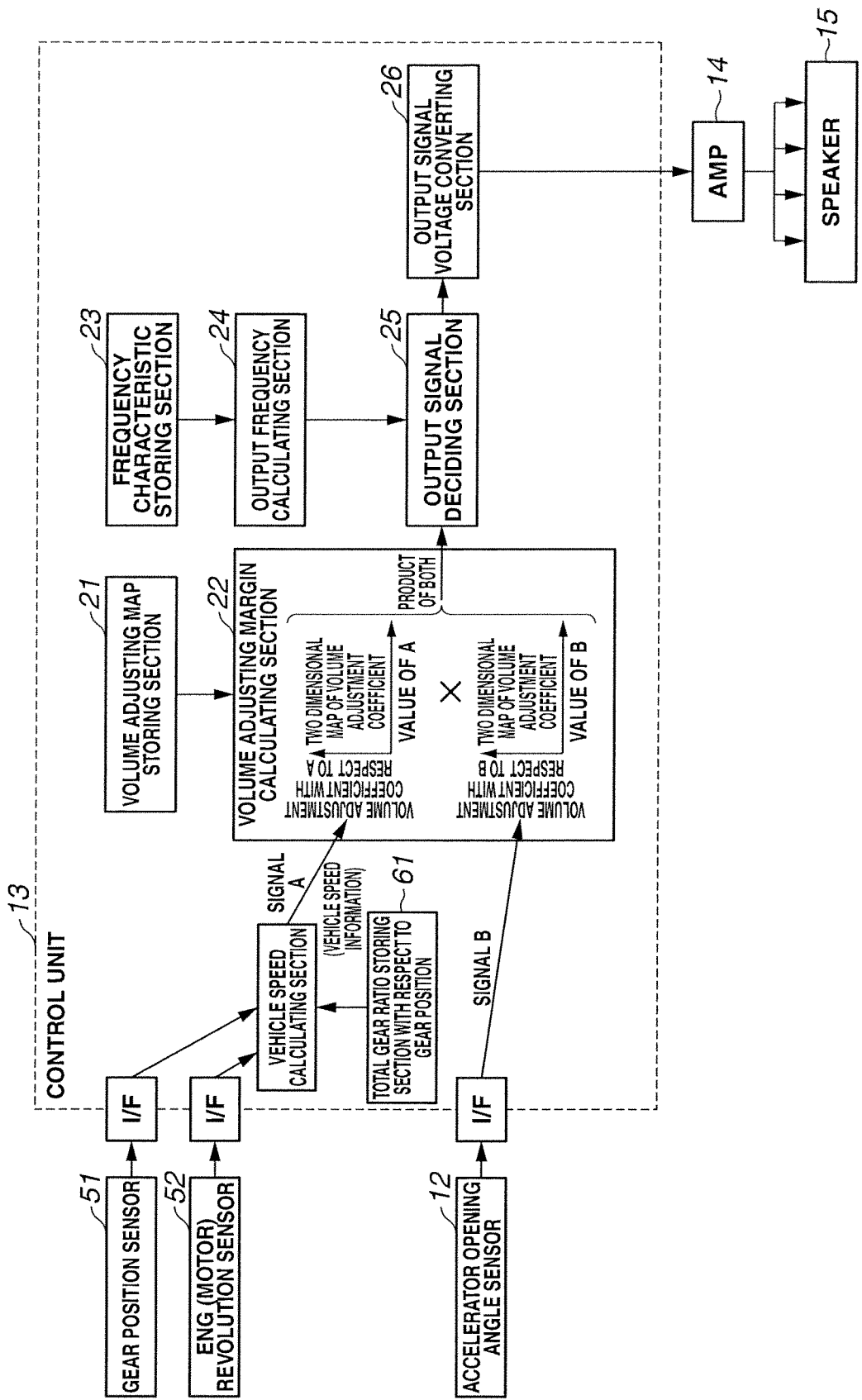
FIG. 14 is a system configuration view of the acceleration transmission device representing a thirteenth preferred embodiment.

FIG. 14 shows a system configuration view of the acceleration transmission device representing a thirteenth preferred embodiment.

In this embodiment, a gear position sensor 51 detecting a gear position, an engine revolution sensor 52 detecting the engine revolution number; accelerator opening angle sensor 12, control unit 13, amplifier 14, and speaker 15 are equipped Control unit 13 includes: a gear ratio storing section 61 storing a total gear ratio with respect to the gear position; vehicle speed calculating section 62; volume adjusting map storing section 21; volume adjusting margin calculating section 22; frequency characteristic storing section 23; output frequency calculating section 24; output signal deciding section 25; and output signal voltage converting section 26.

The gear ratio is introduced from the gear position signal and the vehicle speed is calculated from the engine revolutions or motor revolution.

Thereafter, the same control as described in the first embodiment is the same as the control in the same as the first embodiment.

That is to say, the signal of the gear position is obtained in place of the vehicle speed so that the vehicle speed is calculated from the engine revolution and the gear position. Thereafter, the same control as the first embodiment is carried out. That is to say, the signal of the gear position is obtained In addition, the volume is controlled in the same way as the first embodiment with the signal of the gear position obtained in place of the vehicle speed.

With the gear ratio stored within the control unit and the vehicle speed can be calculated within the control unit from the gear position and the engine revolution.

As described above, the gear position signal is obtained without obtaining the vehicle speed signal and by calculating the vehicle speed according to the gear position signal the acceleration time situation such as the acceleration intention of the driver and the acceleration state of the vehicle can be detected and transmitted.

Figure 15:
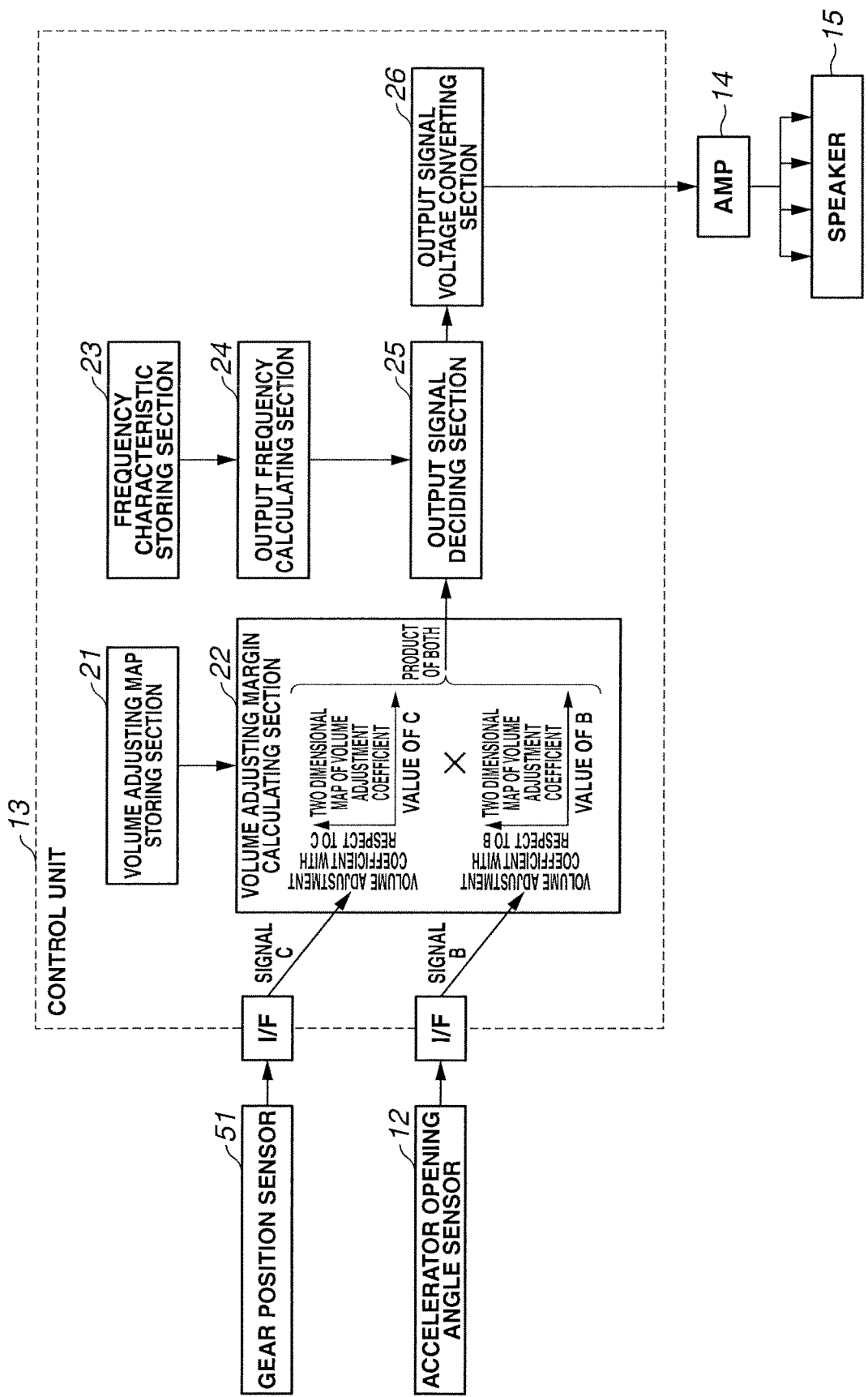
FIG. 15 is a system configuration view of the acceleration transmission device representing a fourteenth preferred embodiment.

FIG. 15 shows a system configuration view of the acceleration information transmission device representing a fourteenth preferred embodiment.

In this embodiment, gear position sensor 51, accelerator opening angle sensor 12, control unit 13, amplifier 14, and speaker 15 are equipped.

Control unit 13 includes: volume adjusting map storing section 21; volume adjusting margin calculating section 22; frequency characteristic storing section 23; output frequency calculating section 24; output signal deciding section 25; and output signal voltage converting section 26.

Parameters used for the volume adjustment are accelerator opening angle APO and the gear position. The volume adjustment is carried out in accordance with a product (or sum) of the volume adjusting map set in accordance with the gear position and the volume adjusting map through accelerator opening angle APO in the same way as the first embodiment.

That is to say, in place of the vehicle speed, the signal of the gear position is obtained so that the volume control is made using the map which accords with the gear position.

The volume adjustment which accords with the gear position is used for the control in accordance with the vehicle speed.

The volume adjustment which accords with the gear position is used for the control which accords with the vehicle speed.

In this way, without obtaining the vehicle speed signal, the gear position signal is obtained so that the acceleration time situation such as the acceleration intention of the driver and the acceleration state of the vehicle can be detected and transmitted.

The acceleration information transmission device in this embodiment detects a transmission ratio of a transmission. As described above, the gear position signal is obtained from the gear position signal without obtaining the vehicle speed signal so that the acceleration time situation such as the acceleration intention of the driver and the acceleration state of the vehicle can be detected and transmitted.

Figure 16:
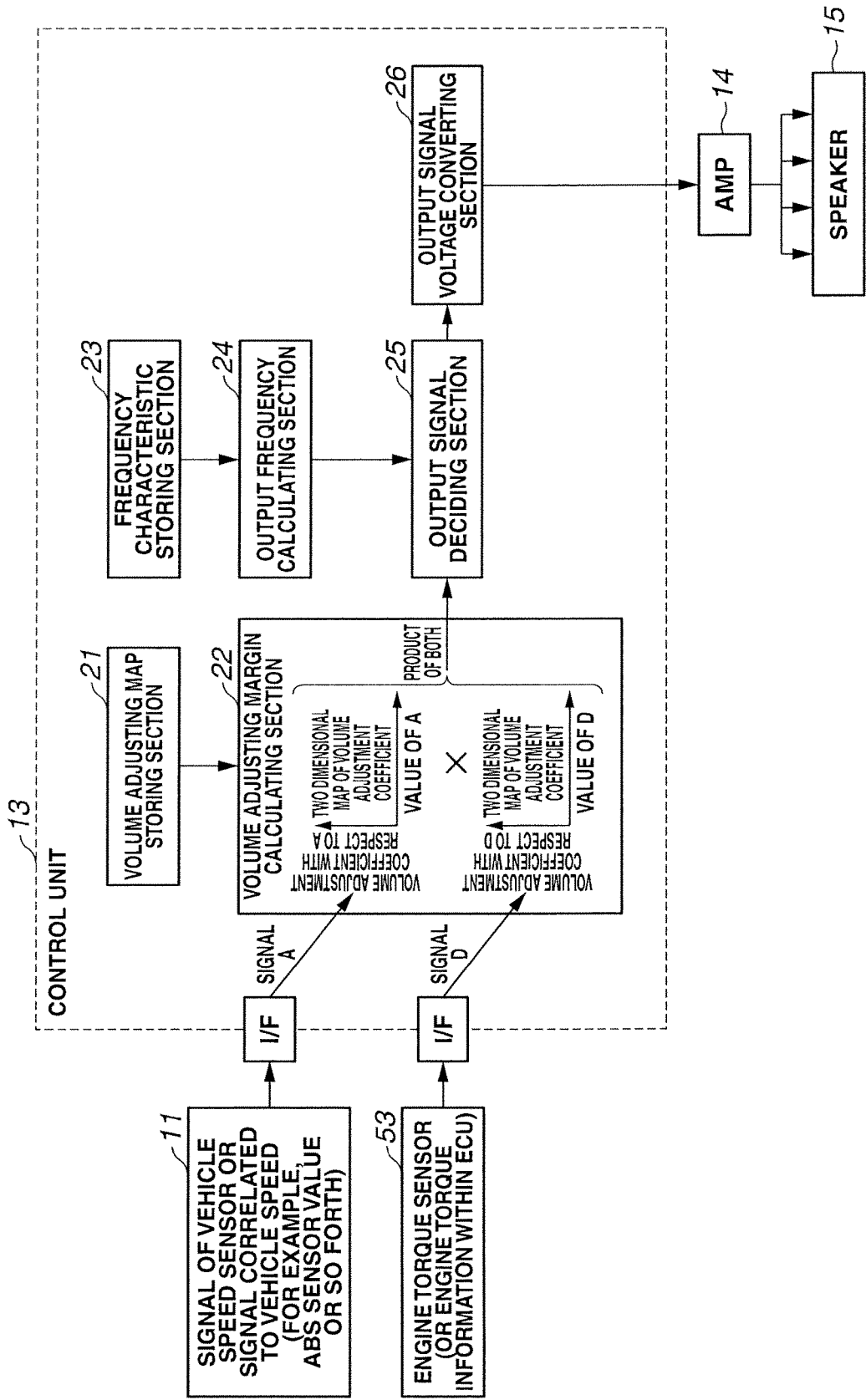
FIG. 16 is a system configuration view of the acceleration transmission device representing a fifteenth preferred embodiment.

FIG. 16 shows a system configuration view of the acceleration information transmission device representing a fifteenth preferred embodiment.

In this embodiment, vehicle speed sensor 11, engine torque sensor 53, control unit 13, amplifier 14, and speaker 15.

Control unit 13 includes: volume adjusting map storing section 21; volume adjusting margin calculating section 22; frequency characteristic storing section 23; output frequency calculating section 24; output signal deciding section 25; and output signal voltage converting section 26. The engine torque is used in place of accelerator opening angle APO. That is to say, the engine torque value at the time of traveling is used in place of accelerator opening angle APO.

Control is changed to the control in accordance with the torque value. In this way, control can be carried out by means of the engine torque without obtaining accelerator opening APO signal.

The acceleration information transmission device in this embodiment has a feature such that accelerator opening angle APO of the driver is detected in accordance with the engine torque.

As described above, control is carried out using the engine torque without obtaining accelerator opening angle APO.

Figure 17:
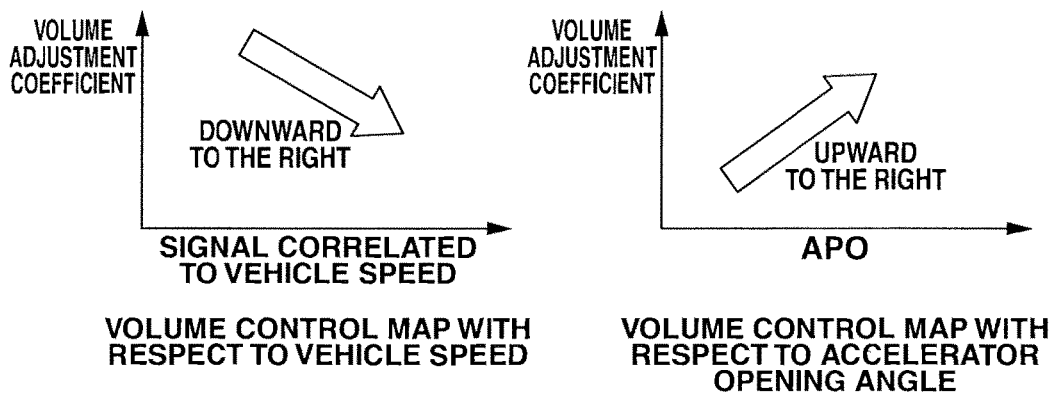
FIG. 17 is control maps used for a calculation of volume adjustment coefficients ka and kv.

FIG. 17 shows control maps used for calculations of volume adjustment coefficients ka and kv. First, control map used for the calculation of volume adjustment coefficient ka which accords with accelerator opening angle APO is set such that as accelerator opening angle APO becomes higher, volume adjustment coefficient ka becomes larger.

On the other hand, the control map used for the calculation of volume adjustment coefficient kv is set such that, as vehicle speed V becomes higher, volume adjustment coefficient kv becomes smaller.

The volume control map is a shape such that, as accelerator opening angle APO signal becomes increased, the coefficient becomes larger and right up (upward to the right) configuration and a shape such that, as the signal (or the gear position, the vehicle speed, or calculated vehicle speed) correlated to the vehicle speed becomes increased, the coefficient becomes constant or becomes smaller and right down (downward to the right) configuration.

That is to say, the volume control map has accelerator opening angle APO such as to the right up (upward to the right) configuration and the signal having the correlation to the vehicle speed is the map of the constant or right down (downward to the right) configuration.

The volume control map is set in such a way that accelerator opening angle APO is upward to the right configuration coefficient map and the signal related to the vehicle speed is right downward (downward to the right) configuration coefficient map. Using these maps, the parameters related to the volume control are carried out. By setting maps having such shapes as described below, the accurate detection of the acceleration intention of the driver can be made.

The acceleration information transmission device in this embodiment has the feature such that, as accelerator opening angle APO becomes larger, the volume of the acceleration sound is made large and, as the vehicle speed corresponding value becomes larger, the volume of the acceleration sound can be made smaller.

The acceleration intention of the driver can accurately be detected by setting the map having the shape described above.

Figure 18:
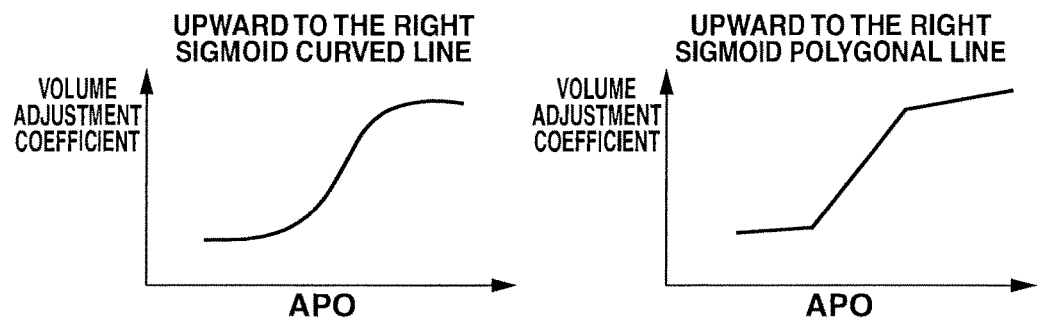
FIG. 18 is control maps used for the calculation of volume adjustment coefficient ka.

FIG. 18 shows control maps used for the calculation of volume adjustment coefficient ka.

The control map used for the calculation of volume adjustment coefficient ka in accordance with accelerator opening angle APO is set such that, as accelerator opening angle APO becomes higher, volume adjustment coefficient ka is set in a letter of S shape (sigmoid) curved line or a letter S shape (sigmoid) polygonal line.

The shape of the map is a right up (upward to the right) letter S shaped (sigmoid) polygonal line or curved line.

That is to say, the volume control map of accelerator opening angle APO is the right up (upward to the right) letter S shape (sigmoid) polygonal line or curved line.

The coefficient map is set by means of right up (upward to the right) letter S shape (sigmoid) polygonal line or curved line. This coefficient map performs the calculation of the volume control parameter. By setting the map of such a shape as described below, the acceleration intention of the driver can accurately be detected.

The acceleration information transmission device in this embodiment has a feature such that, as accelerator opening angle becomes larger, the volume of the accelerator sound is made large in the letter of S shape (sigmoid). By setting the map in such a configuration as described above, the acceleration intention by the driver can accurately be detected.

Figure 19:
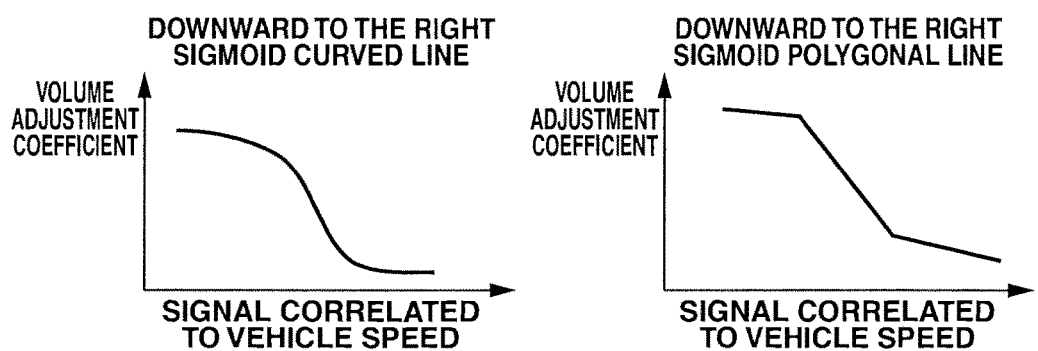
FIG. 19 is control maps used for the calculation of volume adjustment coefficient Kv.

FIG. 19 shows control maps used for the calculation of volume adjustment coefficient kv.

The control map used for the calculation of volume adjustment coefficient kv in accordance with vehicle speed V is set such that, as vehicle speed V becomes higher, volume adjustment coefficient kv becomes smaller in a letter S shape (sigmoid) curved line or letter S shape (sigmoid) polygonal line.

The shape of the map is the polygonal line in the letter of S shape (sigmoid) or in a letter S shape (sigmoid) curved line except a straight line.

That is to say, in a case where the volume control map of the signal having the correlation to the vehicle speed is not the straight line, the shape of the map is the right down (downward to the right) letter S shape (sigmoid) polygonal line or curved line.

The coefficient map is set in the right down (downward to the right) letter S shape (sigmoid) polygonal line or curved line. Thus, the calculation of the volume control parameter is carried out.

This setting performs the calculation of the volume control parameter.

The accurate acceleration state of the vehicle can be detected by setting the map of such a configuration as described above.

The acceleration information transmission device in this embodiment has the feature such that, as the vehicle speed corresponding value becomes larger, the volume of the acceleration sound becomes smaller in the letter of S shape (sigmoid shape).

The accurate detection of the acceleration state of the vehicle can be made by setting the map as in the configuration described above.

Figure 20:
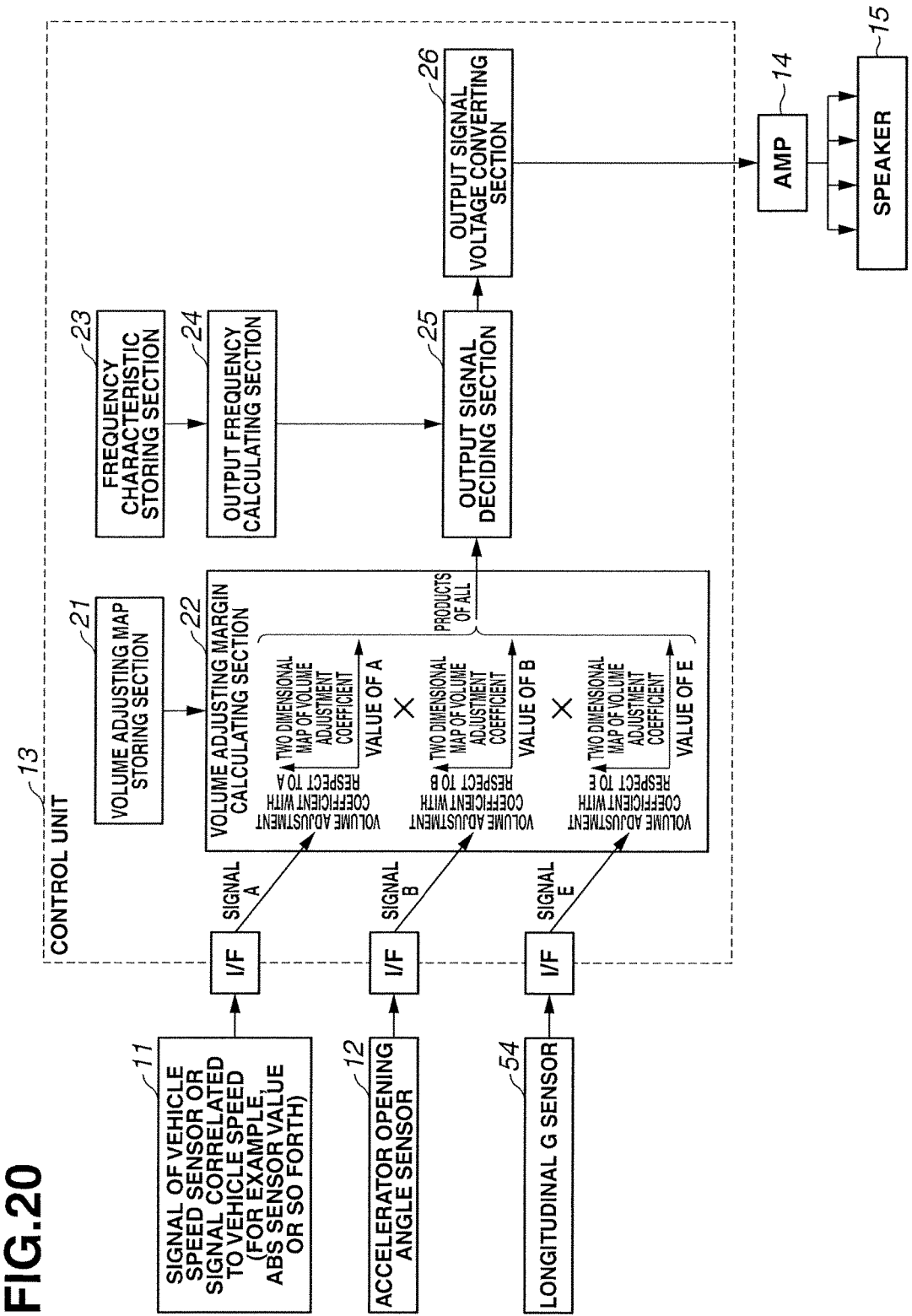
FIG. 20 is a system configuration view of the acceleration transmission device representing a nineteenth preferred embodiment.

FIG. 20 shows a system configuration view of the acceleration information transmission device representing a nineteenth preferred embodiment.

In this embodiment, vehicle speed sensor 11, accelerator opening angle sensor 12, vehicular longitudinal acceleration sensor 54 detecting a longitudinal acceleration of the vehicle, control unit 13; amplifier 14; and speaker 15 are equipped.

Control unit 13 includes: volume adjusting map storing section 21; volume adjusting margin calculating section 22; frequency characteristic storing section 23; output frequency calculating section 24; output signal deciding section 25; and output signal voltage converting section 26.

The control using the volume control map in accordance with the vehicular longitudinal acceleration level is added to the volume adjustment. The volume is controlled by further multiplying or adding the volume control map set in accordance with the longitudinal acceleration.

That is to say, a correction by means of the vehicular longitudinal acceleration is added to the volume control.

The volume adjusting map of the right upward (upward to the right) with respect to the longitudinal acceleration (linear right up (upward to the right) or right up (upward to the right) in the letter S shape (sigmoid) is set. The product or the sum with volume adjustment coefficients calculated through the other volume control maps is taken and the volume is controlled.

In this way, by adding further the vehicular longitudinal acceleration (factor of result system) to the volume control, the detection accuracy at the acceleration time situation such as the acceleration intention of the driver and the acceleration state of the vehicle can be improved.

The acceleration information transmission device has the feature such that the volume of the acceleration sound is adjusted in accordance with the longitudinal acceleration.

In this way, by adding the vehicular longitudinal acceleration (factor of the result system) further to the volume control, the detection accuracy of the acceleration time situation such as the acceleration intention of the driver and the acceleration state of the vehicle can be improved.

Figure 21:
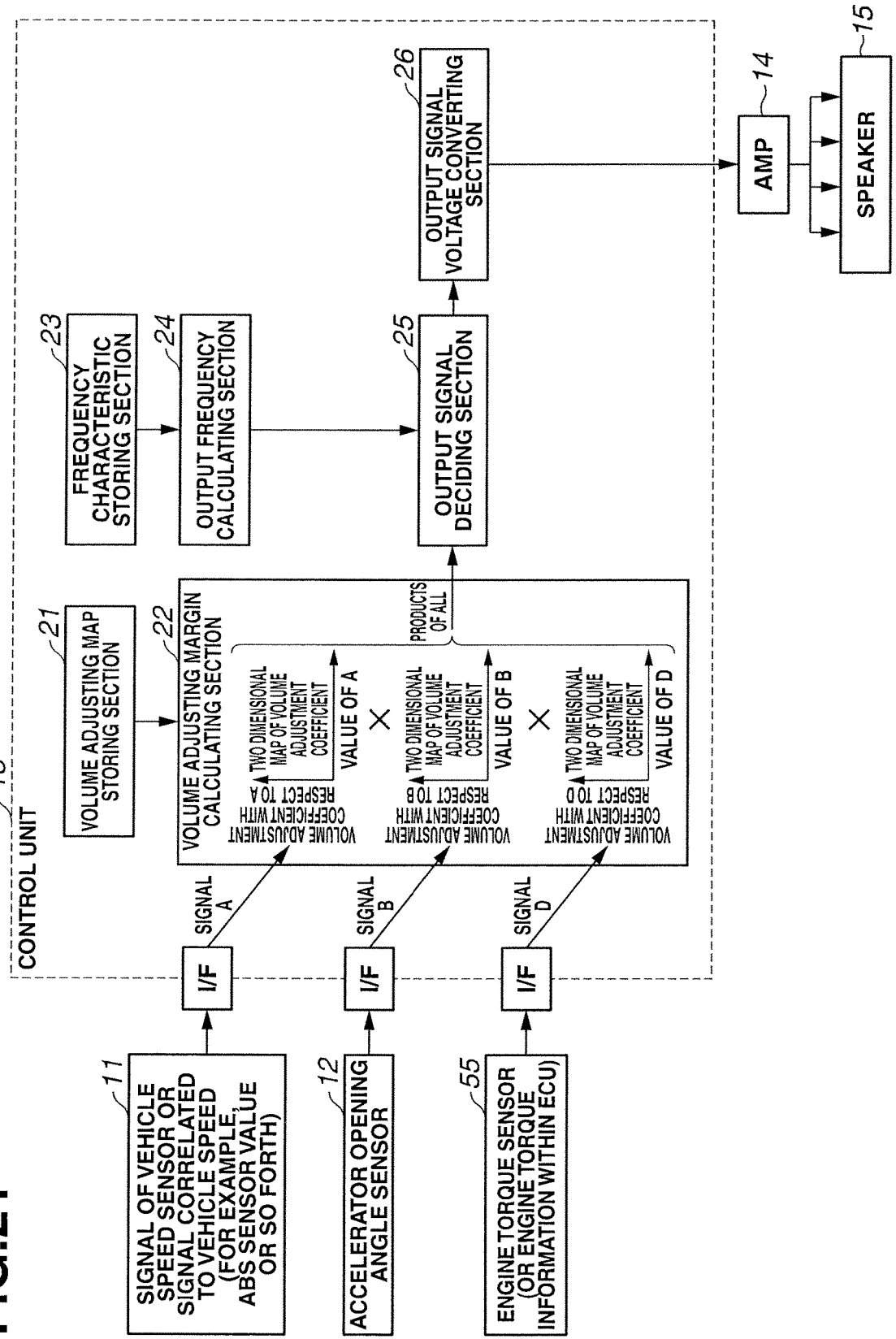
FIG. 21 is a system configuration view of the acceleration transmission device representing a twentieth preferred embodiment.

FIG. 21 shows the system configuration view of the acceleration information transmission device in a twentieth preferred embodiment.

In this embodiment, vehicle speed sensor 11, accelerator opening angle sensor 12, engine torque sensor 55 detecting the engine torque; control unit 13; amplifier 14; and speaker 15.

Control unit 13 includes: volume adjusting map storing section 21; volume adjusting margin calculating section 22; frequency characteristic storing section 23; output frequency calculating section 24; output signal deciding section 25; and output signal voltage converting section 26.

Similarly, as described above, control in accordance with the engine torque is added.

That is to say, a correction due to the engine torque value is added to the volume control.

The volume adjusting map in the right up (upward to the right) with respect to the longitudinal acceleration (liner right up (upward to the right), the right up (upward to the right) in the letter of S (sigmoid), or the right up (upward to the right) in a quadratic curve) is set. The product or sum with the volume adjustment coefficient calculated by the other volume control map is taken to control the volume.

In this way, by adding the vehicular longitudinal acceleration (factor of a result system) to the volume control, the detection accuracy of the acceleration time situation such as the acceleration intention of the driver and the acceleration state of the vehicle can be improved.

The acceleration information transmission device in this embodiment has the feature such that the volume of the acceleration sound is adjusted in accordance with the engine torque.

In this way, by adding the vehicular longitudinal acceleration (factor of the result system) to the volume control, the detection accuracy of the acceleration time situation such as the acceleration intention of the driver or the acceleration state of the vehicle can be improved.

Figure 22:
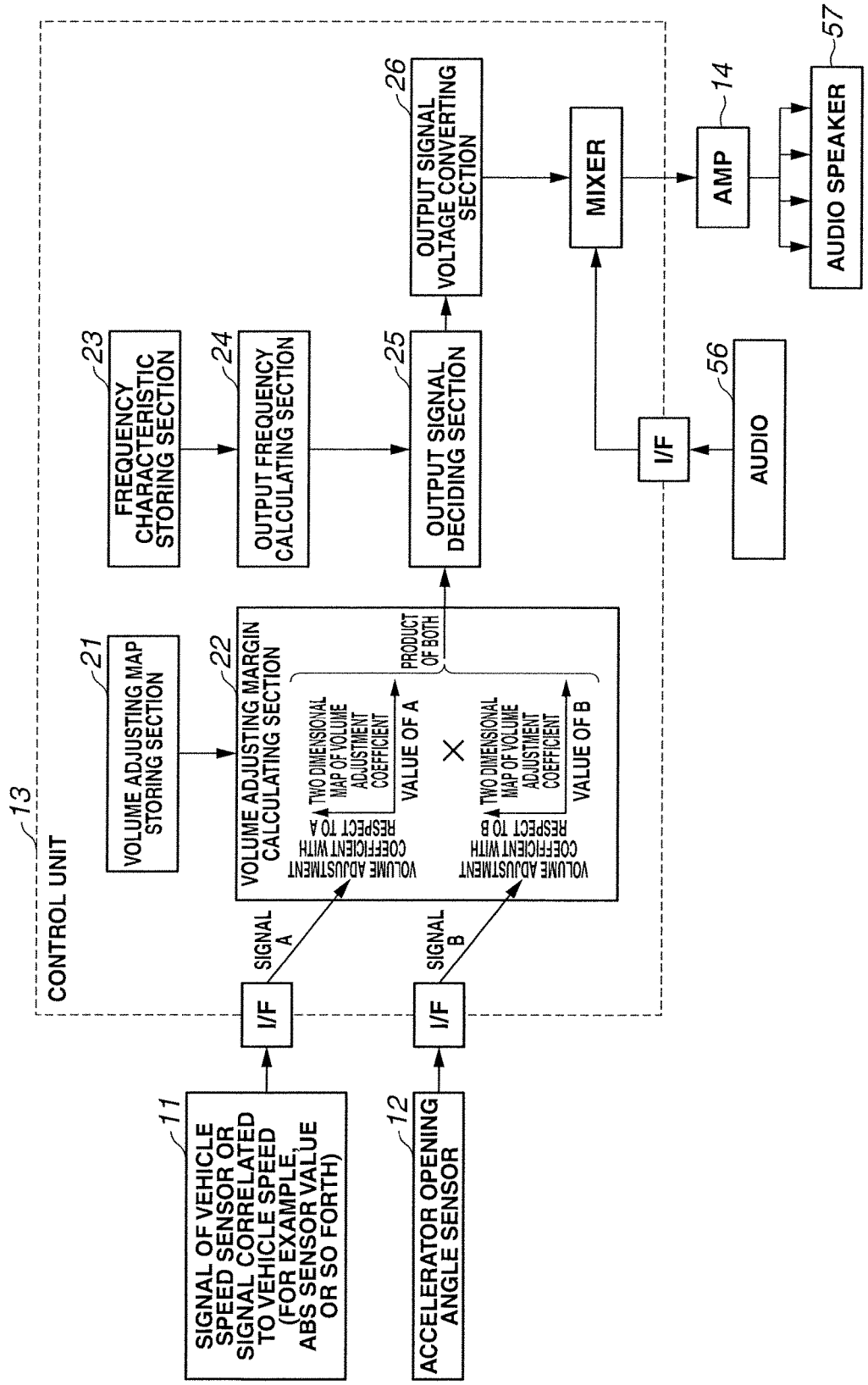
FIG. 22 is a system configuration view of the acceleration transmission device representing a twenty-first preferred embodiment.

FIG. 22 shows a system configuration view of the acceleration information transmission device representing a twentieth preferred embodiment.

In this embodiment, vehicle speed sensor 11, accelerator opening angle sensor 12, control unit 13, an audio 56, amplifier 14, an audio speaker 57 are equipped.

Control unit 13 includes: volume adjusting map storing section 21; volume adjusting margin calculating section 22; frequency characteristic storing section 23; output frequency calculating section 24; output signal deciding section 25; output signal voltage converting section 26; and a mixer 63.

The output derived from control unit 13 is outputted as the sound from vehicular audio speaker 57 via the amplifier of vehicular audio 56. That is to say, the sound is outputted from audio speaker 57.

The acceleration time situation is transmitted at the volume and the speaker which outputs the sound is audio speaker 57.

In this way, it is possible to hear the acceleration sound at the tone color and the tone quality with a high quality via the audio speaker having a large capacity.

The acceleration information transmission device in this embodiment has the feature such that the acceleration sound is transmitted to the driver via the audio speaker.

In this way, it is possible to hear the acceleration sound at the high quality tone color and tone quality by using the speaker having the high capacity.

Figure 23:
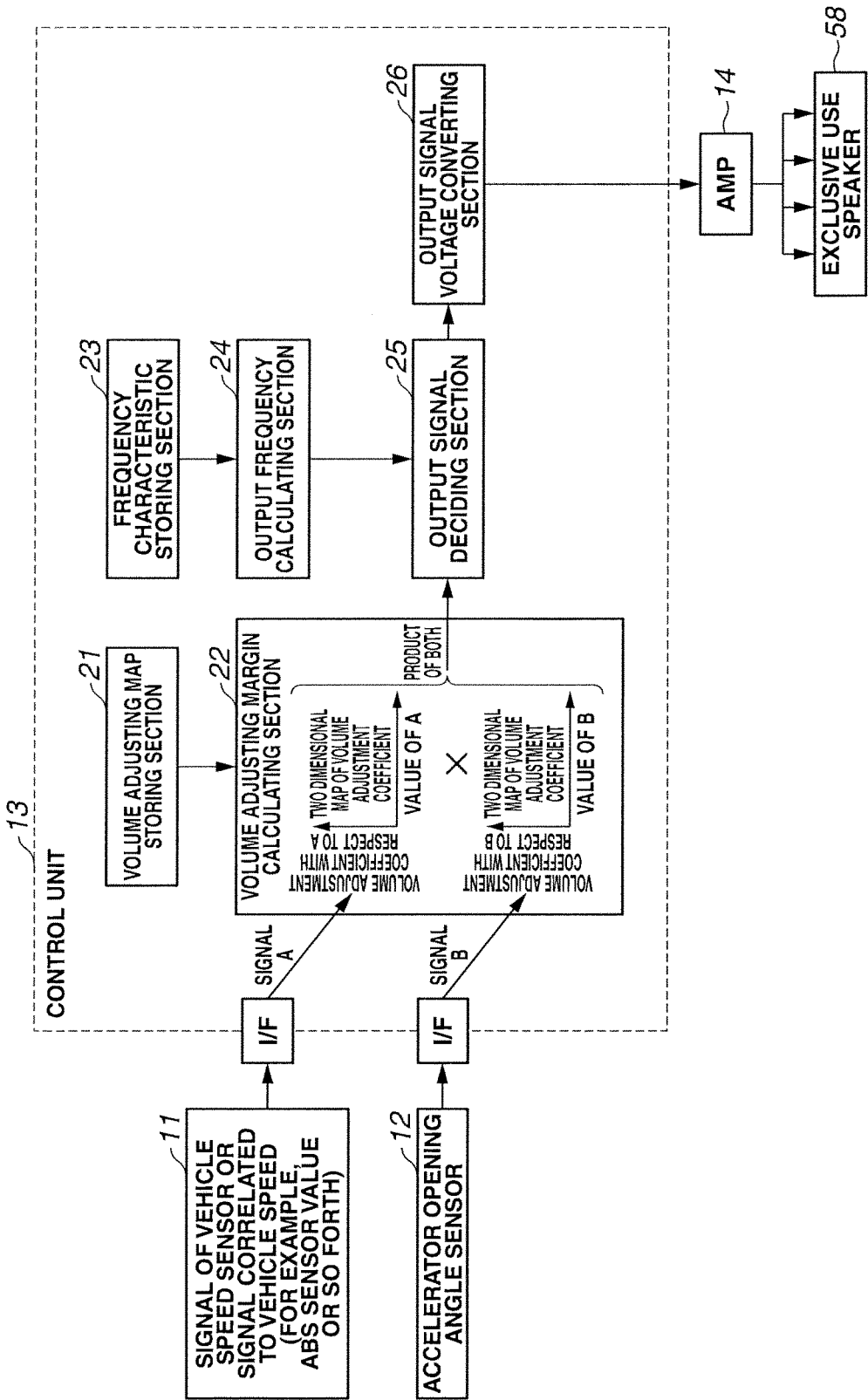
FIG. 23 is a system configuration view of the acceleration transmission device representing a twenty-second preferred embodiment.

FIG. 23 shows the system configuration view of the acceleration information transmission device representing a twenty-second preferred embodiment.

In this embodiment, vehicle speed sensor 11, accelerator opening angle sensor 12, control unit 13, amplifier 14, and an exclusive use speaker 58.

Control unit 13 includes: volume adjusting map storing section 21; volume adjusting margin calculating section 22; frequency characteristic storing section 23; output frequency calculating section 24; output signal deciding section 25; and output signal voltage converting section 26.

The output of control unit 13 is supplied to an exclusive use speaker 58 via an amplifier installed within control unit 13, via an external amplifier, or directly installed in the vehicle and is outputted as the sound from this exclusive use speaker.

That is to say, the acceleration sound is outputted via exclusive use speaker 58.

The acceleration time situation is transmitted with the volume and the speaker which outputs the sound is exclusive use speaker 58.

The sound is outputted to exclusive use speaker 58 via an exclusive amplifier installed within control unit 13 or at a position behind control unit 13.

Thus, the system can be structured without influence on an audio performance or audio structure.

The acceleration information transmission device in this embodiment has the feature such that the acceleration sound is transmitted to the driver via the exclusive speaker different from the audio speaker. Thus, the system can be structured without influence on the audio performance or audio structure.

FIG. 24 shows the system configuration view of the acceleration information transmission device representing a twenty-third preferred embodiment.

In this embodiment, vehicle speed sensor 11, accelerator opening angle sensor 12, control unit 13, and a vibration generator 59 are equipped.

Vibration generator 59 is disposed to enable the transmission of a vibration to the driver. For example, vibration generator 59 includes a steering wheel, a shift knob, a floor mat, an accelerator pedal, sheet, a head rest, and so forth.

Control unit 13 includes: volume adjusting map storing section 21; volume adjusting margin calculating section 22; frequency characteristic storing section 23; output frequency calculating section 24; output signal deciding section 25; and output signal voltage converting section 26.

The acceleration time situation is transmitted to the driver using a vibration purpose motor attached onto a steering or floor. A vibrating force of the motor is controlled by means of the control unit.

That is to say, the acceleration time situation is transmitted through the vibration.

The acceleration time situation is converted into a voltage value within control unit 13 and is outputted to vibration generator 59.

Vibration generator 59 is installed on a steering column, a rack, or a floor and, when the vibration is applied in accordance with the voltage value so that the driver can receive the voltage corresponding vibration.

Hence, the acceleration time situation such as the acceleration intention of the driver or the acceleration state of the vehicle can be transmitted to the driver without use of sound.

The acceleration information transmission device in this embodiment has the feature such that the acceleration vibration is transmitted to the driver via the vibration generator.

Thus, the acceleration time situation such as the acceleration intention of the driver and the acceleration state of the vehicle can be transmitted to the driver without use of sound.

The invention claimed is:

1. An acceleration information transmission device, comprising: an accelerator opening angle sensor configured to detect an accelerator manipulated variable of a driver that provides an input for a vehicle; and a control unit configured to detect a vehicle speed corresponding value in a form of a vehicle state which provides an output of the vehicle, set at least one of an acceleration intention by the driver and an acceleration state of the vehicle in accordance with the accelerator manipulated variable detected by the accelerator opening angle sensor and the detected vehicle state in a form of an acceleration information represented by a sound or a vibration, and transmit the set acceleration information to the driver, wherein the control unit sets the acceleration information in such a manner that, as the accelerator manipulated variable becomes larger, the sound or the vibration becomes larger, and, as the detected vehicle state moves toward a lower speed, the sound or the vibration becomes larger in order to more accurately transmit the at least one of the acceleration intention by the driver and the acceleration state of the vehicle.

2. The acceleration information transmission device as claimed in claim 1, wherein the control unit transmits the acceleration information to the driver via a predetermined buzzer.

3. The acceleration information transmission device as claimed in claim 1, wherein the control unit transmits the acceleration information to the driver via a pre-stored sound source data.

4. The acceleration information transmission device as claimed in claim 3, wherein the control unit comprises the pre-stored sound source data.

5. The acceleration information transmission device as claimed in claim 1, wherein the control unit transmits the acceleration information to the driver via at least one of a plurality of pre-stored sound source data.

6. The acceleration information transmission device as claimed in claim 1, further comprising: a revolution number detecting sensor configured to detect a revolution number of a revolution drive source of the vehicle, wherein the control unit is configured to adjust a frequency characteristic of an acceleration time situation.

7. The acceleration information transmission device as claimed in claim 6, wherein the control unit adjusts the frequency characteristic of the acceleration time situation in accordance with a degree component of the revolution number detected by the revolution number detecting sensor.

8. The acceleration information transmission device as claimed in claim 6, wherein the control unit adjusts the frequency characteristic of the acceleration time situation in accordance with a plurality of degree components of the revolution number detected via the revolution number detecting sensor.

9. The acceleration information transmission device as claimed in claim 1, wherein the control unit calculates a first coefficient which accords with the accelerator manipulated variable detected by the accelerator opening angle sensor and a second coefficient which accords with the vehicle state detected by the control unit, and sets the acceleration information in accordance with a third coefficient which provides a product of both of the first and second coefficients.

10. The acceleration information transmission device as claimed in claim 1, wherein the control unit calculates a first coefficient which accords with the accelerator manipulated variable detected by the accelerator opening angle sensor and a second coefficient which accords with the vehicle state detected by the control unit, and sets the acceleration information in accordance with a third coefficient which provides a sum of both of the first and second coefficients.

11. The acceleration information transmission device as claimed in claim 1, wherein the control unit refers to a three-dimensional map which determines the acceleration information in accordance with the accelerator manipulated variable detected by the accelerator opening angle sensor and the vehicle state detected by the control unit.

12. The acceleration information transmission device as claimed in claim 1, wherein the control unit detects a vehicle speed.

13. The acceleration information transmission device as claimed in claim 1, wherein the control unit detects a vehicle speed in accordance with a revolution number of a revolution drive source of the vehicle and a transmission gear ratio of a transmission.

14. The acceleration information transmission device as claimed in claim 1, wherein the control unit detects a transmission gear ratio of a transmission.

15. The acceleration information transmission device as claimed in claim 1, wherein the accelerator opening angle sensor detects the accelerator manipulated variable of the driver in accordance with a drive torque of a revolution drive source of the vehicle.

16. The acceleration information transmission device as claimed in claim 9, wherein the control unit increases the first coefficient as the accelerator manipulated variable detected by the accelerator opening angle sensor becomes larger, and decreases the second coefficient as the vehicle state detected by the control unit moves toward a higher speed.

17. The acceleration information transmission device as claimed in claim 16, wherein the control unit increases the first coefficient in a sigmoid shape as the accelerator manipulated variable detected by the accelerator opening angle sensor becomes larger.

18. The acceleration information transmission device as claimed in claim 16, wherein the control unit decreases the second coefficient in a sigmoid shape as the vehicle state detected by the control unit moves toward the higher speed.

19. The acceleration information transmission device as claimed in claim 1, further comprising: a longitudinal acceleration sensor configured to detect a longitudinal acceleration of the vehicle, wherein the control unit sets the acceleration information in accordance with the longitudinal acceleration detected by the longitudinal acceleration sensor.

20. The acceleration information transmission device as claimed in claim 1, further comprising: a drive torque detecting sensor configured to detect a drive torque of a revolution drive source of the vehicle, wherein the control unit sets the acceleration information in accordance with the drive torque detected by the drive torque detecting sensor.

21. The acceleration information transmission device as claimed in claim 1, wherein the control unit transmits an acceleration sound to the driver via an audio speaker.

22. The acceleration information transmission device as claimed in claim 1, wherein the control unit transmits an acceleration sound via an exclusive use speaker different from an audio speaker.

23. The acceleration information transmission device as claimed in claim 1, wherein the control unit transmits an acceleration vibration to the driver via a vibration generator.

* * * * *